(12) United States Patent
Okimoto et al.

(10) Patent No.: US 10,959,326 B2
(45) Date of Patent: Mar. 23, 2021

(54) STRETCHABLE CIRCUIT SUBSTRATE AND ARTICLE

(71) Applicant: DAI NIPPON PRINTING CO., LTD., Tokyo-to (JP)

(72) Inventors: Naoko Okimoto, Tokyo-to (JP); Kenichi Ogawa, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 16/761,155

(22) PCT Filed: Oct. 12, 2018

(86) PCT No.: PCT/JP2018/038090
§ 371 (c)(1),
(2) Date: May 1, 2020

(87) PCT Pub. No.: WO2019/093069
PCT Pub. Date: May 16, 2019

(65) Prior Publication Data
US 2020/0267835 A1    Aug. 20, 2020

(30) Foreign Application Priority Data

Nov. 7, 2017  (JP) .............................. JP2017-215039

(51) Int. Cl.
*H05K 1/02*  (2006.01)
*H05K 1/11*  (2006.01)
*H05K 3/46*  (2006.01)

(52) U.S. Cl.
CPC ........... *H05K 1/0283* (2013.01); *H05K 1/118* (2013.01); *H05K 3/4644* (2013.01)

(58) Field of Classification Search
CPC .. H05K 1/0283; H05K 1/0277; H05K 1/0278; H05K 1/028; H05K 1/0281
See application file for complete search history.

(56) References Cited

U.S. PATENT DOCUMENTS

2004/0192082 A1    9/2004 Wagner et al.
2007/0032089 A1    2/2007 Nuzzo et al.
(Continued)

FOREIGN PATENT DOCUMENTS

JP    2007-281406 A    10/2007
JP    2016-509375 A    3/2016
(Continued)

OTHER PUBLICATIONS

Chung et al.; "Inkjet-printed stretchable silver electrode on wave structured elastomeric substrate;" Appl. Phys. Lett.; 2011; pp. 153110-1-153110-3; vol. 98.
(Continued)

*Primary Examiner* — Jeremy C Norris
(74) *Attorney, Agent, or Firm* — Oliff PLC

(57) ABSTRACT

A stretchable circuit substrate includes: a base material being stretchable; a wiring which is on a first surface side of the base material, and which includes a bellows-like member including a plurality of ridges and recesses arranged in a first direction which is one of in-plane directions in the first surface of the base material; and an adjustment layer which includes the bellows-like member and is on the first surface side of the base material so as to at least overlap, in a plan view, a wiring region in which the wiring is positioned; wherein the adjustment layer has a Young's modulus smaller than a Young's modulus of the wiring.

20 Claims, 26 Drawing Sheets

(56) References Cited

U.S. PATENT DOCUMENTS

2014/0218872 A1* 8/2014 Park .................. H05K 1/0283
                                                        361/749
2015/0348800 A1   12/2015 Cho et al.

FOREIGN PATENT DOCUMENTS

| JP | 2016-219543 A | 12/2016 |
| KR | 10-2014-0058239 A | 5/2014 |
| WO | 2014/130928 A2 | 8/2014 |

OTHER PUBLICATIONS

Lee et al.; "Lateral-crack-free, buckled, inkjet-printed silver electrodes on highly pre-stretched elastomeric substrates;" J. Phys. D: Appl. Phys.; 2013; pp. 1-5; vol. 46.

Byun et al.; "Fully printable, strain-engineered electronic wrap for customizable soft electronics;" Scientific Reports; 2017; pp. 1-11; vol. 7, No. 45328.

Kaltenbrunner et al.; "An ultra-lightweight design for imperceptible plastic electronics;" Nature; 2013; pp. 458-465; vol. 499.

Yokota et al.; "Ultraflexible organic photonic skin;" Sci. Adv.; 2016; pp. 1-8; vol. 2.

Jan. 8, 2019 Search Report issued in International Patent Application No. PCT/JP2018/038090.

* cited by examiner

STRETCHABLE CIRCUIT SUBSTRATE AND ARTICLE

TECHNICAL FIELD

The present disclosure is related to a stretchable circuit substrate including stretchable substrate and wiring.

BACKGROUND ART

In recent years, stretchable electronics have been attracted attentions and the development of a stretchable circuit substrate capable of being stretched has been actively advanced. As one of the methods for obtaining the stretchable circuit substrate, Patent Document 1 suggests a method in which a base material being stretchable is expanded in advance, a metal thin film is disposed on the base material that is in the state being expanded, and then the base material is relaxed.

CITATION LISTS

Patent Document

Patent Document 1: Japanese Patent Application Laid-Open (JP-A) No. 2007-281406

Non-Patent Documents

Non-Patent Document 1: Seungjun Chung et al., "Inkjet-printed stretchable silver electrode on wave structured elastomeric substrate", Appl. Phys. Lett. 98, 153110 (2011)

Non-Patent Document 2: Jaemyon Lee et al., "Lateral-crack-free, buckled, inkjet-printed silver electrodes on highly pre-stretched elastomeric substrates", Appl. Phys. 46 (2013) 105305

Non-Patent Document 3: Junghwan Byun et al., "Fully printable, strain-engineered electronic wrap for customizable soft electronics", Scientific Reports 7:45328, 24 Mar. 2017

Non-Patent Document 4: Martin Kaltenbrunner et al., "An ultra-lightweight design for imperceptible plastic electronics", Nature, July 2013

Non-Patent Document 5: Tomoyuki Yokota et al., "Ultra-flexible organic photonic skin", Sci. Adv. 2016; 2: e1501856 15 Apr. 2016

SUMMARY

Technical Problem

In the above described production method of the stretchable circuit substrate, when the base material shrinks as it is relaxed, the metal thin film changes its form to bellows-like shape to have a bellows-like member in which ridges and recesses continuously appear along the in-plane direction of the base material. The thin metal film including the bellow-like member can follow expansion of the base material by expanding the bellow-like member to the in-plain direction when the base material is expanded. For that reason, in such a stretchable circuit substrate, change in the resistance value of the metal thin film along with the stretch of the base material can be inhibited.

Meanwhile, in the above described production method of the stretchable circuit substrate, the degree of changes of the form of the thin metal film when it changes to bellows-like shape may vary on positions due to difference of extension of the base material when it is expanded and difference of distribution density of the thin metal film on the base material. When the degree of change in forms of the metal thin film is uneven, there are some cases where the extent of curves and bends of the metal thin film locally increases. On the spot where the extent of the curves and the bends appear in the metal thin film is locally large, stress concentrates to generate fractures such as bent, and the resistance value may increase when the stretchable circuit substrate is repeatedly stretched as well.

The present disclosure has been made in view of the above problem, and an object of the present disclosure is to provide a stretchable circuit substrate in which the fracture such as bent of a wiring and the increase in the resistance value of the wiring can be inhibited.

Solution to Problem

In order to achieve the object, the present disclosure provides a stretchable circuit substrate comprising: a base material being stretchable; a wiring which is on a first surface side of the base material, and which includes a bellows-like member including a plurality of ridges and recesses arranged in a first direction which is one of in-plane directions in the first surface of the base material; and an adjustment layer which includes the bellows-like member and is on the first surface side of the base material so as to at least overlap, in a plan view, with a wiring region in which the wiring is positioned; wherein the adjustment layer has a Young's modulus smaller than a Young's modulus of the wiring.

The present disclosure also provides a stretchable circuit substrate comprising: a base material being stretchable; a wiring which is on a first surface side of the base material, and which includes a bellows-like member including a plurality of ridges and recesses arranged in a first direction which is one of in-plane directions in the first surface of the base material; and an adjustment layer which includes the bellows-like member and is on the first surface side of the base material so as to at least overlap, in a plan view, a wiring region in which the wiring is positioned; wherein the adjustment layer has a Young's modulus larger than a Young's modulus of the base material.

The present disclosure also provides an article comprising the above described stretchable circuit substrate.

Advantageous Effects

The fracture such as bent of a wiring and the increase in the resistance value of the wiring can be inhibited by the present disclosure.

DESCRIPTION OF EMBODIMENTS

Figure 1A:
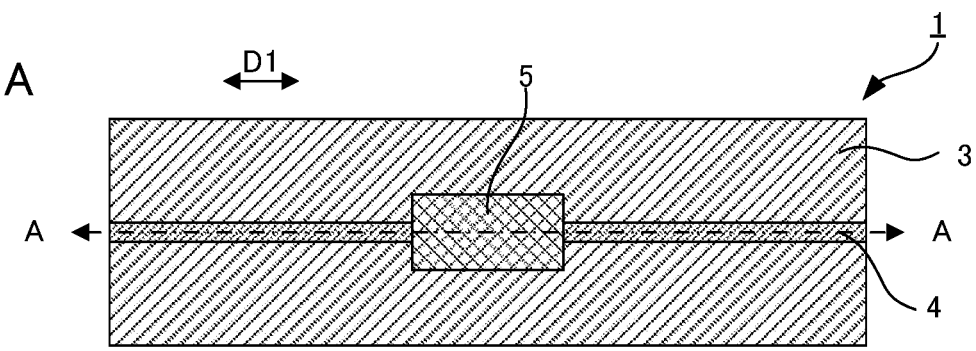
FIGS. 1A and 1B are a schematic plan view and a cross-sectional view illustrating an example of the stretchable circuit substrate of the present disclosure.

The stretchable circuit substrate of the present disclosure will be hereinafter described in details. The stretchable circuit substrate of the present disclosure has two embodiments. Each of the embodiments will be hereinafter separately described.

A. First Embodiment

The stretchable circuit substrate in the first embodiment of the present disclosure comprises a base material being stretchable; a wiring which is on a first surface side of the base material, and which includes a bellows-like member including a plurality of ridges and recesses arranged in a first direction which is one of in-plane directions in the first surface of the base material; and an adjustment layer which includes the bellows-like member and is on the first surface side of the base material so as to at least overlap, in a plan view, a wiring region in which the wiring is positioned; wherein the adjustment layer has a Young's modulus smaller than a Young's modulus of the wiring.

"Stretchable" signifies characteristics of being capable of expanding and contracting; in other words, characteristics of being capable of expanding from a normal unstretched state and being capable of recovering when it is released from the stretched state. The unstretched state is a state when a tensile stress is not applied.

The "wiring which is on a first surface side of the base material" means that the wiring may be positioned directly on the first surface of the base material, and the wiring may be in between the first surface side of the base material and an additional member.

Also, the "adjustment layer which is on the first surface side of the base material" means that the adjustment layer may be positioned directly on the first surface of the base material, and the adjustment layer may be in between first surface side of the base material and an additional member.

An explanation of a position of the member which is on the first surface side of the base material may be the same as the explanation of the position of the wiring which is on the first surface side of the base material, and the explanation of the position of the adjustment layer which is on the first surface side of the base material.

The stretchable circuit substrate of the present embodiment will be described with reference to drawings. In the drawings referred in the present disclosure, the same part or the part having the same function is designated the same reference numerical or a similar reference numerical, and repeated explanations thereof may be omitted in some cases.

Figure 1B:
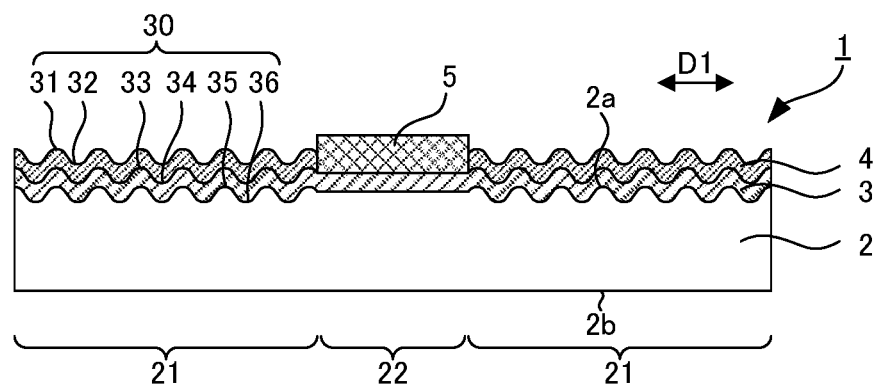

FIG. 1A is a schematic plan view and FIG. 1B is a cross-sectional view illustrating an example of the stretchable circuit substrate of the present embodiment, and FIG. 1B is a cross-sectional view in A to A line of FIG. 1A. Stretchable circuit substrate 1 illustrated in FIGS. 1A and 1B comprises base material 2 being stretchable, wiring 4 which is on first surface 2a side of the base material 2, and adjustment layer 3 which is on the first surface 2a side of the base material 2 and in wiring region 21 in which the wiring 4 is positioned, and has a Young's modulus smaller than a Young's modulus of the wiring 4. In FIGS. 1A and 1B, the adjustment layer 3 is positioned between the base material 2 and the wiring 4. Incidentally, the adjustment layer 3 may be on the surface of the wiring 4 which is opposite side surface to the base material 2 side surface. In FIGS. 1A and 1B, the adjustment layer 3 is positioned on the entire surface of the first surface 2a side of the base material 2. The adjustment layer 3 is positioned at the wiring region 21 as well as at functional member region 22 that is adjacent to the wiring region 21 and to which functional member 5 is mounted. The adjustment layer 3 may be positioned in the place at least of the wiring region 21. Also, the stretchable circuit substrate 1 may comprise the functional member 5 on the first surface 2a side of the base material 2.

In the stretchable circuit substrate 1, the wiring 4 and the adjustment layer 3 includes bellows-like member 30 in which ridges 31, 33, 33 and recesses 32, 34, 36 in the normal direction of the first surface 2a of the base material 2 continuously appear along with in-plane direction of the first surface 2a of the base material 2. In FIGS. 1A and 1B, the ridge 31 is a ridge that appears at surface of the wiring 4 which is opposite to the surface of the wiring 4 which faces the base material 2, the ridge 33 is a ridge that appears in the surface of the wiring 4 which faces the base material 2 and the surface of the adjustment layer 3 which is opposite to the surface of the adjustment layer 3 which faces the base material, and the ridge 35 is a ridge that appears in the surface of the adjustment layer 3 which faces the base material 2. Also, the recess 32 is a recess that appears at surface of the wiring 4 which is opposite to the surface of the wiring 4 which faces the base material 2, the recess 34 is a recess that appears in the surface of the wiring 4 which faces the base material 2, and the surface of the adjustment layer 3 which is opposite to the surface of the adjustment layer 3 which faces the base material 2, and the recess 36 is a recess that appears in the surface of the adjustment layer 3 which faces the base material 2. As described later, in the production method of the stretchable circuit substrate, when the wiring 4 is disposed on the first surface 2a side of the base material 2 which is in the state being expanded in advanced ("on" here includes a case an additional layer is interposed therebetween; hereinafter the same is true), and when the base material 2 is contracted by removing tensile stress from the base material 2, the wiring 4 would change its form to bellows-like shape as shown in FIG. 1B to have the bellows-like member 30. Likewise, the adjustment layer 3 would also have the bellows-like member 30.

Hereinafter, the direction from the ridge toward the recess in the bellows-like member that is the direction in which the ridges and the recesses of the bellows-like member continuously appear may be referred to as a first direction. In FIGS. 1A and 1B, the wiring 4 extends parallelly to the first direction D1.

In the present disclosure, the wiring includes the bellows-like member. When the stretchable circuit substrate is expanded, the base material can be expanded by its elastic modification since the base material is stretchable. If the wiring also expanded similarly by its elastic modification, the total length of the wiring would increase and the cross-sectional area of the wiring would decrease; as a result, the resistance value of the wiring would increase. Also, there is a possibility that fractures such as a crack in the wiring is caused by the elastic modification of the wiring. Whereas, in the present disclosure, the wiring includes the bellows-like member, and thus the wiring follows the expansion of the base material when the base material expands, since the bellows-like member changes its form to reduce the undulation, that is to eliminate the bellows-like shape. Thereby, increase in the total length of the wiring along with the expansion of the base material and decrease in the cross-section area of the wiring can be inhibited. Accordingly, increase in the resistance value of the wiring caused by the expansion of the stretchable circuit substrate can be inhibited. Also, generation of fractures such as crack in the wiring can be inhibited.

In the production method of the stretchable circuit substrate, when the wiring changes its form to bellows-like shape, the degree of change in form varies with positions due to the factors such as uneven stretch of the base material when it is expanded and difference in distribution density of the metal thin film on the base material. When the degree of change in forms of the wiring is uneven, there are some cases where the extent of curves and bends appear in the wiring locally increases. Stress concentrates on the spot where the extent of the curves and the bends appear in the wiring is locally large. Also, in general, an elastomer is used for the base material and a material such as a metal and an alloy is used for the wiring; thus, the Young's modulus of the wiring is extremely larger than the Young's modulus of the base material. In other words, the wiring is harder and much difficult to changes its form than the base material. For that reason, stress easily concentrates on the spot where the extent of the curves and the bends appear in the wiring is locally large. On the spot where stress concentrates in the wiring, fractures such as bent may be generated, and the resistance value increases when the stretchable circuit substrate repeatedly stretches as well.

Whereas, in the present embodiment, the stress can be dispersed by positioning an adjustment layer having a Young's modulus smaller than that of the wiring, which means it is softer than the wiring and more easily changes its form, at the wiring region of the first surface side of the base material. Accordingly, even when the extent of curves and bends appear in the wiring are locally large, stress concentration on the spot where the extent of the curves and the bends appear in the wiring is locally large can be reduced. Thereby, the fracture of the wiring and the increase in the resistance value of the wiring when the stretchable circuit substrate repeatedly stretches can be inhibited.

The stretchable circuit substrate of the present embodiment comprises at least a base material being stretchable, a wiring, and an adjustment layer. Each component of the stretchable circuit substrate in the present embodiment will be hereinafter described.

1. Adjustment Layer

The adjustment layer in the present embodiment is a member: typically, positioned on the first surface side of the base material; also positioned in the wiring region; includes a bellows-like member in which ridges and recesses in the normal direction of the first surface of the base material continuously appear along with the in-plane direction of the first surface of the base material; and has Young's modulus smaller than that of the wiring.

The Young's modulus of the adjustment layer is smaller than the Young's modulus of the wiring. Also, the Young's modulus of the adjustment layer is preferably larger than the Young's modulus of the base material being stretchable. In other words, it is preferable that the adjustment layer has a Young's modulus which is in the middle of that of the wiring and that of the base material. The reason therefor is because stress concentration can be reduced when the adjustment layer having a Young's modulus which is in the middle of that of the wiring and that of the base material, which means it is softer than the wiring and more easily changes its form as well as harder than the base material and more difficultly changes its form, is positioned in the wiring region of the first surface side of the base material.

Also, as described later, when the stretchable circuit substrate of the present embodiment includes a supporting base material between the base material and the wiring, the Young's modulus of the adjustment layer may be smaller than the Young's modulus of the supporting base material, may be the same as the Young's modulus of the supporting base material, and may be larger than the Young's modulus of the supporting base material. Among these, the Young's modulus of the adjustment layer is preferably smaller than the Young's modulus of the supporting base material. The reason therefor is because stress concentration can be reduced when the adjustment layer having a smaller Young's modulus than that of the wiring and that of the supporting base material, which means it is softer than the wiring and the supporting base material and more easily changes its form, is positioned in the wiring region of the first surface side of the base material.

In specific, the Young's modulus of the adjustment layer may be less than 1 time of the Young's modulus of the wiring, and is preferably 0.9 times or less, more preferably 0.1 times or less, and further preferably 0.05 times or less. Also, the Young's modulus of the adjustment layer may be 0.001 times or more of the Young's modulus of the wiring, and is preferably 0.01 times or more.

Also, the Young's modulus of the adjustment layer may be more than 1 time of the Young's modulus of the base material being stretchable, is preferably 1.1 times or more, and more preferably 2 times or more. Also, the Young's modulus of the adjustment layer may be 100 times or less of the Young's modulus of the base material being stretchable, and is preferably 10 times or less.

The reason therefor is because it may be difficult to reduce stress concentration in cases where the Young's modulus of the adjustment layer is too small or too large.

Also, the Young's modulus of the adjustment layer may be, for example, 1 GPa or less, is preferably 100 MPa or less, and more preferably 10 MPa or less. Also, the Young's modulus of the adjustment layer may be, for example, 10 kPa or more, and is preferably 1 MPa or more. The reason therefor is because it may be difficult to reduce stress concentration in cases where the Young's modulus of the adjustment layer is too small or too large.

The Young's modulus of each member is a Young's modulus at a room temperature (25° C.)

As a method for measuring the Young's modulus of the adjustment layer, a method of conducting a tensile test according to JIS K6251 using a sample of the adjustment layer may be adopted. Also, as a method of obtaining the Young's modulus of the adjustment layer, a measurement method with a nano-indentation according to ISO14577 may be adopted as well. In specific, the Young's modulus of the adjustment layer may be measured by using a nano-indenter. Examples of the method for preparing the sample of the adjustment layer may include a method of taking out a part of the adjustment layer from the stretchable circuit substrate as a sample, and a method of taking out a part of the adjustment layer as a sample prior to constituting the stretchable circuit substrate. Other than those, as a method of obtaining the Young's modulus of the adjustment layer, a method of analyzing materials composing the adjustment layer and obtaining the Young's modulus of the adjustment layer based on the existing database of the materials may be adopted as well.

The method of obtaining the Young's modulus of each member such as the wiring, the base material being stretchable, and the supporting base material, is the same as the method of obtaining the Young's modulus of the adjustment layer. Also, as the method of calculating these Young's moduluses, an appropriate standard depending on the form of the member may be used. For example, for the later described stretch controlling part and supporting base material, a method of conducting a tensile test according to ASTM D882 may be adopted.

The adjustment layer includes a bellows-like member. The bellows-like member may be the same as a bellows-like member included in the wiring described layer.

A material of the adjustment layer is the one having the above described Young's modulus, and it may and may not be stretchable. Above all, the material of the adjustment layer preferably is stretchable. The reason therefor is because the adjustment layer may have resistance to change in form when it includes a material being stretchable.

Examples of a material not being stretchable usable in the adjustment layer may include a resin. As the resin, general resins may be used; for example, any of a thermoplastic resin, a thermosetting resin, and a photocurable resin may be used. Also, when the adjustment layer includes a resin, a resin base material may be usable as the adjustment layer.

The stretchability of the material being stretchable usable in the adjustment layer may be the same as the stretchability of the base material being stretchable described later.

Examples of the material being stretchable usable in the adjustment layer may include an elastomer. As the elastomer, a general thermoplastic elastomer and thermosetting elastomer may be used. Specific examples thereof may include a styrene-based elastomer, an olefin-based elastomer, a urethane-based elastomer, an amide-based elastomer, a silicone rubber, a urethane rubber, a fluorine rubber, polybutadiene, polyisobutylene, polystyrenebutadiene, and polychloroprene. When the material composing the adjustment layer is these resins, the adjustment layer may have transparency. Also, the adjustment layer may have characteristics of light shielding such that shielding ultraviolet ray. For example, the adjustment layer may be black. The color of the adjustment layer may be the same as the color of the base material. The adjustment layer may also have design properties to have a decorative function.

Also, when the adjustment layer is in contact with the wiring, it preferably has insulation. A resin or an elastomer can make the adjustment layer insulative.

The adjustment layer is positioned in at least the wiring region; for example, it may be positioned in the entire surface of the first surface side of the base material, and may be positioned at part of the first surface side of the base material.

Among the above, for example, as shown in FIG. 1B and FIGS. 2A to 2C, it is preferable that the adjustment layer 3 is positioned continuously in the wiring region 21 and the functional member region 22 which is adjacent to the wiring region 21 and to which the functional member 5 is mounted.

In the stretchable circuit substrate, the height of the ridges in the bellows-like member is locally increased in some cases due to factors such as uneven thickness of the base material and difference in distribution density of the wiring arranged on the base material. For example, a large ridge is generated in the wiring near the border between the wiring and the functional member. In this case, large stress would be applied to an electronically connected part between the wiring and the functional member and there is a risk the electronically connected part is damaged.

Whereas, wiring generation of the large ridge in the wiring near the border between the wiring and the functional member can be inhibited if the adjustment layer is positioned continuously in the wiring region and the functional member region. Thereby, the damage of the electronically connected part between the wiring and the functional member can be inhibited. A functional member surrounding region described later may be apprehended as a part of the wiring region.

Figure 2A:
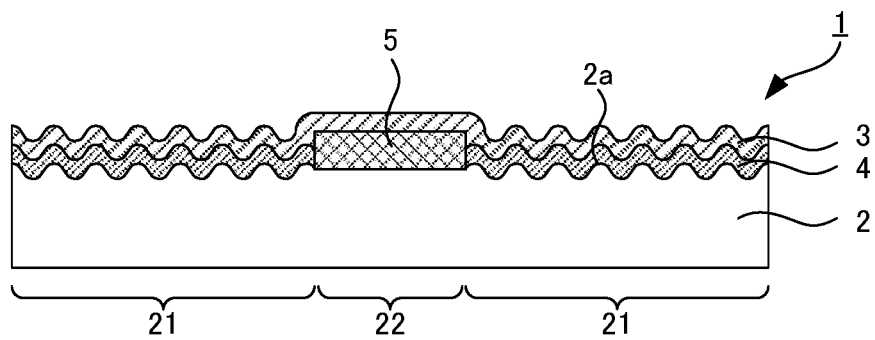
FIGS. 2A to 2D are schematic cross-sectional views illustrating an additional example of the stretchable circuit substrate of the present disclosure.
Figure 2B:
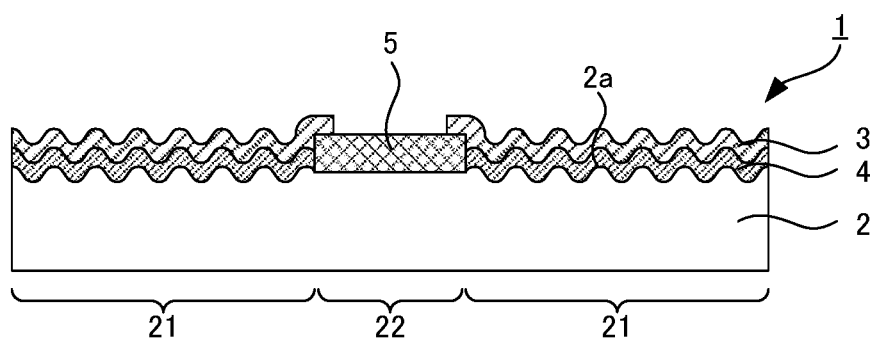
Figure 2C:
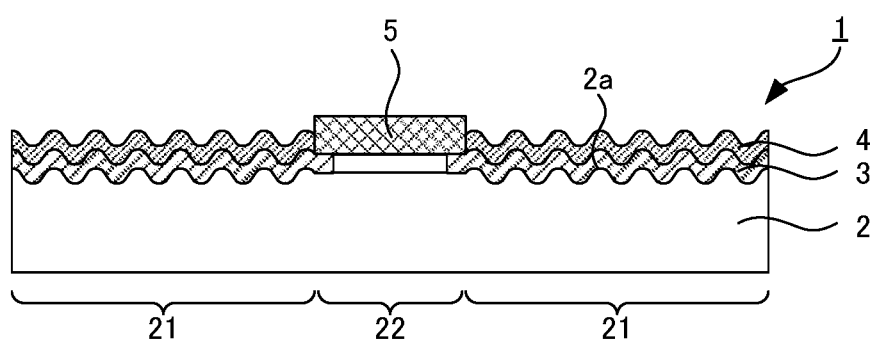

When the adjustment layer is positioned continuously in the wiring region and the functional member region, the adjustment layer is positioned continuously in at least the wiring region and the functional member region; for example, the adjustment layer 3 may be positioned in the entire region of the functional member region 22 as illustrated in FIG. 1B and FIG. 2A, and may be positioned at a part of the functional member region 22 as illustrated in FIGS. 2B to 2C. When the adjustment layer is positioned at apart of the functional member region, for example, the adjustment layer may, in a plan view, have a shape including an opening where apart of the functional member is exposed.

Figure 2D:
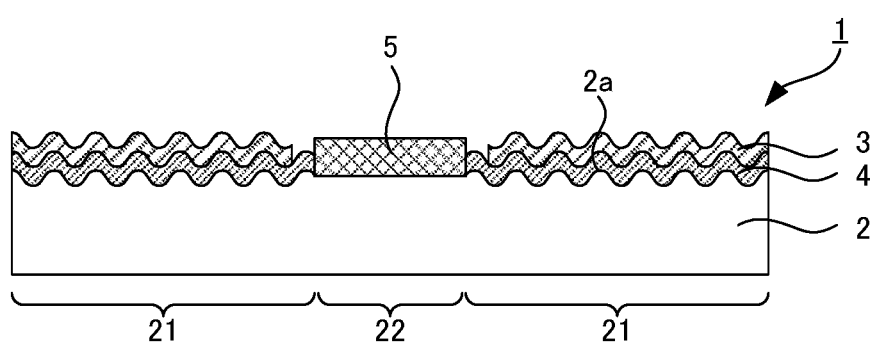

Also, the adjustment layer 3 may not be positioned in the functional member region 22 as illustrated in FIG. 2D; in other words, it may not be positioned continuously in the wiring region 21 and the functional member region 22. In this case, as described later, it is preferable that the stretchable circuit substrate in the present embodiment comprises a second stretch controlling part which is positioned at either the first surface side of the base material, the second surface side of the base material, or inside the base material, also positioned in the functional member surrounding region positioned in the surroundings of the functional member region, and is extended to the border between the functional member surrounding region and the functional member region. In other words, the second stretch controlling part is, in a plan view, preferably positioned in the border between the functional member surrounding region and the functional member region. The reason therefor is because the generation of the large ridge in the wiring near the functional member can be inhibited when the second stretch controlling part is arranged in the functional member surrounding region, and also the second stretch controlling part is extended to the border between the functional member surrounding region and the functional member region. Thereby, the damage of the electronically connected part between the wiring and the functional member can be inhibited. Also, when the wiring includes a terminal part to be connected to the functional member, the adjustment layer may, in a plan view, cover the wiring region entirely excluding the terminal part of the wiring.

The position of the adjustment layer described above is the same for the case when the stretchable circuit substrate of the present embodiment includes the supporting base material between the base material and the wiring.

The adjustment layer is positioned on the first surface side of the base material; for example, the adjustment layer 3 may be positioned between the base material 2 and the wiring 4 as illustrated in FIG. 1B and FIG. 2C, and may be positioned at surface of the wiring 4 which is the opposite surface of the wiring 4 facing the base material 2 as illustrated in FIGS. 2A, 2B, and 2D.

Figure 3A:
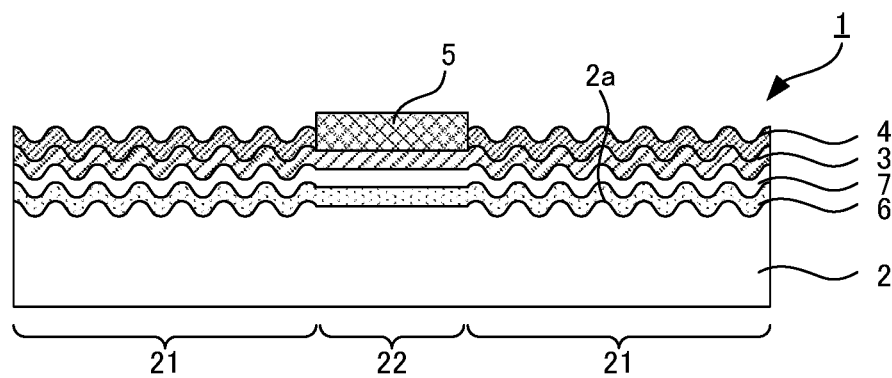
FIGS. 3A to 3D are schematic cross-sectional views illustrating an additional example of the stretchable circuit substrate of the present disclosure.
Figure 3B:
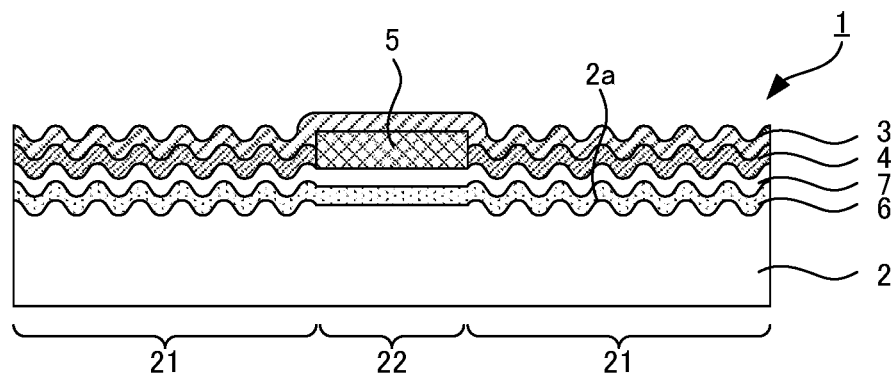
Figure 3C:
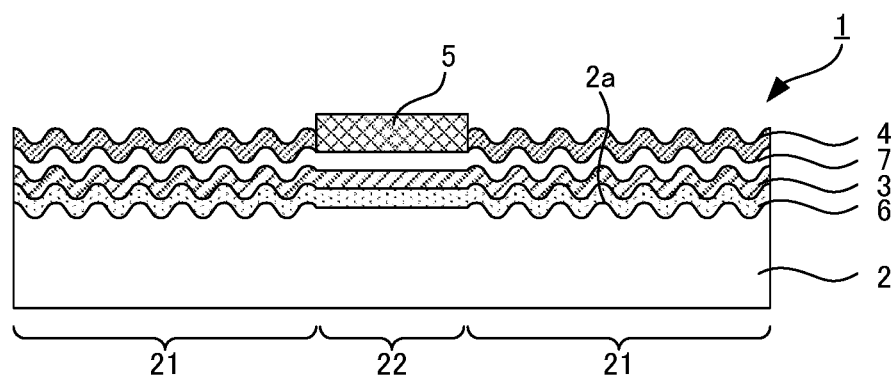
Figure 3D:
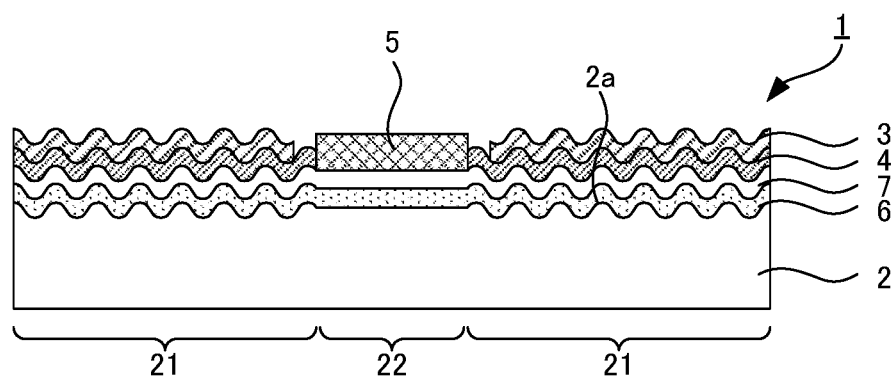
Figure 4:
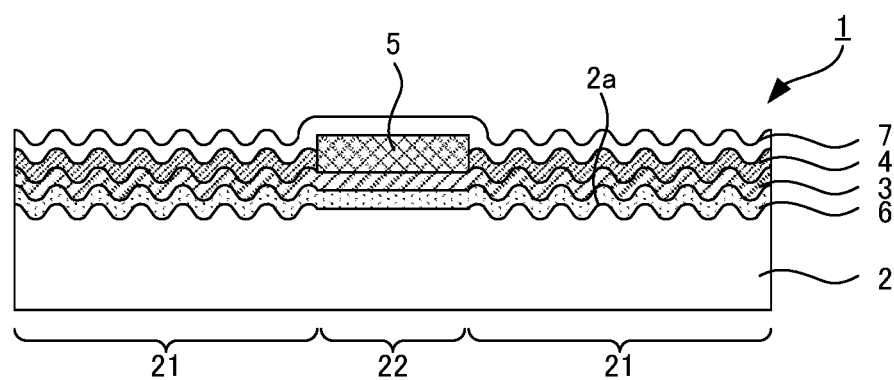
FIG. 4 is a schematic cross-sectional view illustrating an additional example of the stretchable circuit substrate of the present disclosure.

Also, when the stretchable circuit substrate of the present embodiment includes a supporting base material between the base material and the wiring, for example, the adjustment layer 3 may be positioned between the supporting base material 7 and the wiring 4 as illustrated in FIG. 3A, may be positioned at surface of the wiring 4 which is the surface opposite to the surface of the wiring 4 facing the supporting base material 7 as illustrated in FIGS. 3B and 3D, and may be positioned between the base material 2 and the supporting base material 7 as illustrated in FIG. 3C. Also, when the adjustment layer is positioned between the base material and the supporting base material, and when the stretchable circuit substrate of the present embodiment includes an adhesive layer between the base material and the supporting base material, the adjustment layer 3 may be positioned between the adhesive layer 6 and the supporting base material 7 as illustrated in FIG. 3C. Also, as illustrated in FIG. 4, the supporting base material 7 may be positioned at surface of the wiring 4 which is the opposite surface of the wiring 4 facing the base material 2.

Above all, the adjustment layer is preferably positioned on the surface of the wiring which is the surface opposite to the surface of wiring facing the base material. The reason therefor is because stress concentration can be effectively reduced when the adjustment layer having a Young's modulus smaller than that of the wiring and larger than that of the base material is positioned at the surface of the wiring which is the surface opposite to the surface of wiring facing the base material. Further, when the adjustment layer is positioned at the surface of the wiring which is the surface opposite to the surface of wiring facing the base material, the adjustment layer works as a shape protecting layer as well. For example, a pressurizing treatment and a heating and pressurizing treatment may be conducted in some cases during the production of the stretchable circuit substrate after producing the bellows-like shape. Even after conducting such a treatment, the case where the adjustment layer is positioned at the surface of the wiring which is the surface opposite to the surface of wiring facing the base material is advantageous such that the shape of the bellows-like member would not easily get out of shape.

Also, when the adjustment layer is positioned between the base material and the wiring, and when the stretchable circuit substrate of the present embodiment includes the supporting base material between the base material and the wiring, the adjustment layer is preferably positioned between the supporting base material and the wiring. The reason therefor is because stress concentration can be effectively reduced when the adjustment layer having a Young's modulus smaller than that of the wiring is positioned on the surface of the wiring facing the base material.

Figure 5A:
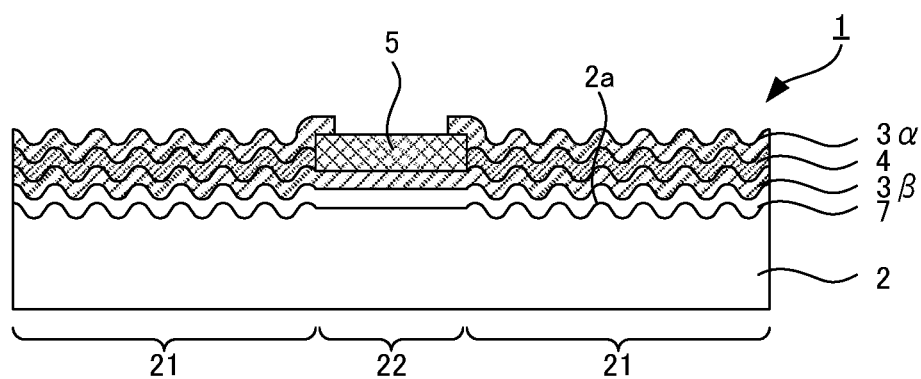
FIGS. 5A and 5B are schematic cross-sectional views illustrating an additional example of the stretchable circuit substrate of the present disclosure.
Figure 5B:
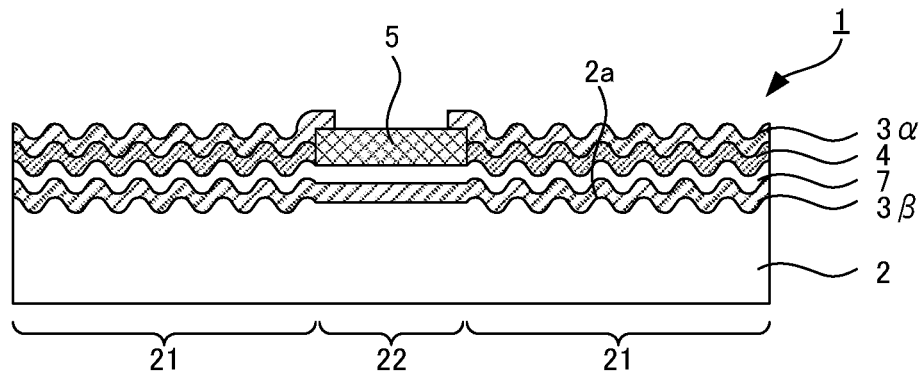

The stretchable circuit substrate of the present embodiment may comprise just one layer of the adjustment layer, and may comprise two or more layers of the adjustment layer. Above all, it is preferable that the adjustment layer is included on the both surface of the wiring, as a first adjustment layer and a second adjustment layer respectively on one surface and the other surface of the wiring. When the first adjustment layer and the second adjustment layer are positioned respectively on the both surface of the wiring, it is possible to further disperse the stress which tends to be concentrated at the point where the degree of curves and bends generated in the wiring is locally large. For example, in FIG. 5A, first adjustment layer 3a is positioned on one surface of the wiring 4, second adjustment layer 3β is positioned on the other surface of the wiring 4, and the supporting base material 7 is further positioned between the second adjustment layer 3β and the base material 2. On the other hand, in FIG. 5B, the first adjustment layer 3a is positioned on one surface of the wiring 4, the second adjustment layer 3β is positioned on the other surface of the wiring 4, and the supporting base material 7 is further positioned between the wiring 4 and the second adjustment layer 3β. The materials of the first adjustment layer 3a and the second adjustment layer 3β may be the same and may be different. Also, the thicknesses of the first adjustment layer $3\alpha$ and the second adjustment layer $3\beta$ may be the same and may be different.

The adjustment layer usually does not have adhesion. When the stretchable circuit substrate of the present embodiment includes the supporting base material between the base material and the wiring, an adhesive layer is included in some cases between the base material and the supporting base material; however, the adjustment layer is distinguished from such an adhesive layer.

Here, "does not have adhesion" means that the adhesion of the adjustment layer is 0.01 N/25 mm or less, and it is preferably 0.005 N/25 mm or less, and more preferably 0.001 N/25 mm or less.

As a method for measuring the adhesion of the adjustment layer, a method of conducting a 180° peeling test using a sample of the adjustment layer can be adopted. Examples of the method for preparing the sample of the adjustment layer includes a method of taking out a part of the adjustment layer from the stretchable circuit substrate as a sample, and a method of taking out a part of the adjustment layer as a sample prior to constituting the stretchable circuit substrate. As a method for measuring the adhesion of the adjustment layer, a method of analyzing materials composing the adjustment layer and obtaining the adhesion of the adjustment layer based on the existing database of the materials can be adopted. In the 180° peeling test, first, a test piece having 25 mm width is taken out, and a glass plate having 25 mm width is attached to the adjustment layer side surface of the test piece. Next, measure the adhesion (N/25 mm) to the glass plate by using a tensile test machine at the conditions as follows: tensile speed: 1200 mm/minute, peeling angle: 180°, temperature: 20° C., and humidity: 50%.

The thickness of the adjustment layer is a thickness which tolerates the stretch, and may be appropriately selected depending on the factors such as materials of the adjustment layer. The thickness of the adjustment layer is, for example, 0.1 µm or more, is preferably 1 µm or more, and more preferably 10 µm or more. Also, the thickness of the adjustment layer is, for example 1 mm or less, is preferably 500 µm or less, and more preferably 100 µm or less. If the adjustment layer is too thin, the effect of reducing stress concentration cannot be sufficiently attained in some cases. Also, if the adjustment layer is too thick, the bending rigidity of the adjustment layer would increase even when the Young's moduluses satisfy the above described relationship, and it is difficult to reduce stress concentration in some cases. The bending rigidity is the product of the cross-sectional secondary moment of a targeted member and the elastic coefficient of the material composing the targeted member, and its unit is $N\cdot m^2$ or $Pa\cdot m^4$. The cross-sectional secondary moment of the adjustment layer can be calculated based on a cross-section of a part of the adjustment layer overlaps with the wiring is cut by a plane orthogonal to the stretch direction of the stretchable circuit substrate wiring. Also, the thickness of the adjustment layer may be, at least partially, decreased along with the direction from the functional member region toward the wiring side region.

A method for arranging the adjustment layer on the first surfaces of the base material may be appropriately selected depending on factors such as the materials of the adjustment layer and the layer structure of the stretchable circuit substrate. Examples of the method include a method of coating a resin composition for the adjustment layer on the first surface of the base material, a method of bonding the adjustment layer to the first surface of the base material by interposing the adhesive layer, a method of thermally laminating the base material and the adjustment layer, and a method of simultaneously molding the base material and the adjustment layer.

Hereafter, when the adjustment layer is bonded to the first surface of the base material by interposing the adhesive layer, this adhesive layer is referred to as a first adhesive layer in some cases.

There are no particular limitations on the first adhesive layer, and general pressure sensitive adhesives and adhesives usable for circuit substrates may be used.

The first adhesive layer usually has a bellows-like member. The bellows-like member can be the same as the bellow-member included in the wiring as described later.

The thickness of the first adhesive layer is not limited to the extent the first adhesive layer is stretchable and can be attached to the first surface of the base material; for example, it is in a range of 10 µm or more and 100 µm or less.

The first adhesive layer may be a molecule adhesive layer. "Molecule adhesive" means to adhesively bond two articles with chemical bonding by applying a compound to be the molecule adhesive between the two of articles. In the present disclosure, the base material and the adjustment layer can be adhesively bonded with chemical bonding using the molecule adhesive.

As the molecule adhesive usable in the molecule adhesive layer, known molecule adhesives can be used, and it may be appropriately selected according to applications of the stretchable circuit substrate. Examples thereof include a silane coupling agent and a thiol-based compound.

The thickness of the molecule adhesive layer is, for example, about a few nanometer (nm) to 100 nm.

Examples of a method for arranging the molecule adhesive layer include a method such that the first surface of the base material and the surface of the adjustment layer facing to the base material are surface-modified with the molecule adhesive.

2. Wiring

The wiring in the present embodiment is a member which is positioned on the first surface of the base material, and includes a bellows-like member in which ridges and recesses in the normal direction of the first surface of the base material appear continuously along with in-plane direction of the first surface of the base material, and has conductivity.

The stretchable circuit substrate of the present embodiment may include a plurality of the wiring. In examples shown in FIGS. 1A and 1B, the wiring 4 extends parallelly to the first direction D1 in which the ridges 31, 33, 35 and recesses 32, 34, 36 of the bellows-like member 30 continuously appear. Also, although not illustrated, the stretchable circuit substrate may include a wiring which extends to a different direction from the first direction.

The amplitude of the bellows-like member is, for example, 1 µm or more, is preferably 10 µm or more, more preferably 50 µm or more, and further preferably 100 µm or more. Also, the amplitude of the bellows-like member is, for example, 500 µm or less, is preferably 400 µm or less, and more preferably 300 µm or less. The amplitude of the bellows-like member being the above range allows the wiring to easily change its form so as to follow the expansion of the base material.

Figure 6:
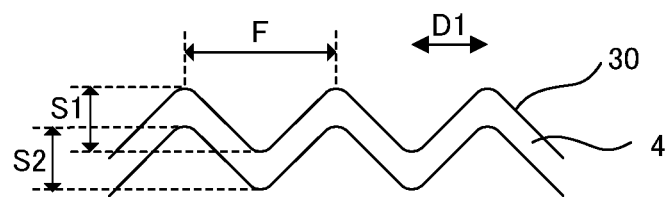
FIG. 6 is a schematic diagram illustrating an example of the bellows-like member of the wiring in the stretchable circuit substrate of the present disclosure.

The amplitude of the bellows-like member refers to, as signified as signs S1 and S2 shown in FIG. 6, a distance between a ridge and a recess next to each other in the normal direction to the first surface of the base material. The amplitude S1 is an amplitude of the bellows-like member 30 of the wiring 4 on the surface wiring which is the opposite surface of the wiring 4 facing the base material, in the normal direction to the base material. Also, the amplitude S2 is an amplitude of the bellows-like member 30 of the wiring 4 on the surface facing the base material wiring, in the normal direction of the base material.

The amplitude of the bellows-like member can be calculated by, for example, measuring the distances in the normal direction to the first surface of the base material between the ridges and the recesses next to each other in a certain range of the length direction of the wiring, and obtaining the average of the distances. The certain range of the length direction of the wiring is, for example, 10 mm. As a measurement device for measuring the distances between the ridges and the recesses next to each other, a non-contact type measurement device using means such as a laser microscope can be used, and a contact type measurement device is can be used. Also, the distances between the ridges and the recesses next to each other can be measured based on images such as a picture of section.

The cycle of the bellows-like member is, for example, 10 μm or more, is preferably 50 μm or more, and more preferably 100 μm or more. Also, the cycle of the bellows-like member is, for example, 1000 μm or less, is preferably 750 μm or less, and more preferably 500 μm or less. The cycle of the bellows-like member being the above range allows the wiring to stretch.

The cycle of the bellows-like member refers to a distance in the first direction D1 between ridges next to each other such as the one signified as a reference sign F in FIG. 6.

The cycle of the bellows-like member can be calculated by, for example, measuring distances in the first direction of the ridges next to each other in a certain range of the length direction of the wiring, and obtaining the average of the distances. The certain range of the length direction of the wiring is, for example, 10 mm. As a measurement device for measuring the distances between the ridges next to each other, a non-contact type measurement device using means such as a laser microscope can be used, and a contact type measurement device can be used. Also, the distances between the ridges next to each other can be measured based on images such as a picture of section.

The Young's modulus of the wiring is larger than the Young's modulus of the adjustment layer; for example, it is 100 MPa or more, and is preferably 200 MPa or more. Also, the Young's modulus of the wiring is, for example, 300 GPa or less, is preferably 200 GPa or less, and more preferably 100 GPa or less. Although stress concentration easily occurs in cases where the Young's modulus of the wiring is the above range, the stress concentration can be reduced in the present embodiment since the adjustment layer is arranged.

The method for obtaining the Young's modulus of the wiring is in the same manner as in the method for obtaining the Young's modulus of the adjustment layer described above.

A material of the wiring is any material that can follow the expansion and contraction of the base material using the elimination and generation of the bellows-like member. The material of the wiring can be stretchable or non-stretchable.

Examples of the non-stretchable material used for the wiring include a metal such as gold, silver, copper, aluminium, platinum, and chrome; and an alloy containing these metals. When the material of the wiring is non-stretchable, a metal film may be used as the wiring.

The stretchability of the stretchable material used for the wiring can be the same as the stretchability of the base material being stretchable described later.

Examples of the stretchable material used for the wiring include a conductive composition containing conductive particles and an elastomer. In other words, the wiring can contain conductive particles and an elastomer. The conductive particles can be anything that can be used in the wiring, and examples thereof include particles of gold, silver, copper, nickel, palladium, platinum, and carbon. Among them, silver particles are preferably used. Also, as the elastomer, general thermoplastic elastomers and thermosetting elastomers can be used, and examples thereof include a styrene-based elastomer, an acrylic elastomer, an olefin-based elastomer, a urethane-based elastomer, a silicone rubber, a urethane rubber, a fluorine rubber, a nitrile rubber, polybutadiene, and polychloroprene.

The shape of the wiring in a plan view is not particularly limited but is preferably a straight line shape as illustrated in FIG. 1A. The reason therefor is to easily design the stretchable circuit substrate. The wiring may function as an electrode. Examples of the electrode include an electrode for a solar battery and an electrode for an organic electroluminescence.

The thickness of the wiring is the thickness which tolerates the stretch, and can be appropriately selected depending on the factors such as materials of the wiring.

For example, when the material of the wiring is non-stretchable, the thickness of the wiring can be 25 nm or more, is preferably 50 nm or more, and more preferably 100 nm or more. Also, the thickness of the wiring may be 50 μm or less, is preferably 10 μm or less, and more preferably 5 μm or less.

When the material of the wiring is stretchable, the thickness of the wiring can be 5 μm or more, is preferably 10 μm or more, and more preferably 20 μm or more. Also, the thickness of the wiring can be 60 μm or less, is preferably 50 μm or less, and more preferably 40 μm or less.

The width of the wiring can be, for example, 50 μm or more, and can be 10 mm or less as well.

A method for forming the wiring is appropriately selected depending on factors such as materials. When the material of the wiring is non-stretchable, examples of the method include a method in which a metal film is formed on the base material or on the supporting base material by means such as a vapor deposition method, a spattering method, a plating method, or transferring and crimping a metal foil, and then the metal film is subjected to patterning using a photolithography method. Also, when the material of the wiring is stretchable, examples of the method includes a method in which a conductive composition containing the above described conductive particles and elastomer is printed on the supporting base material in a pattern using a general printing method.

3. Base Material being Stretchable

The base material in the present embodiment is a member being stretchable. The base material includes a first surface facing the wiring, and a second surface opposite to the first surface. The base material shall be, for example a member in a plate shape.

The base material is stretchable. Examples of the parameter that expresses the stretchability of the base material include a recovery. The recovery of the base material when it is expanded 50% (to the length of 1.5 times of the initial state) from the basis of the normal state (non-expanded state) and then released from the expanded state, is preferably 80% or more, more preferably 85% or more, and further preferably 90% or more. The upper limit of the recovery is 100%.

The recovery can be obtained in the manner such that a test piece having 25 mm width is prepared, the test piece is expanded 50% and kept as expanded for 1 hour, and then releasing from the expansion to recover and leaving as is for 1 hour, and applying the following calculation formula:

Recovery (%)=(length right after expanded−length after recovered)/(length right after expanded−length before expanded)*100.

The length right after expanded refers to the length in the state expanded 50%.

An additional example of the parameters that expresses the stretchability of the base material can be an elongation rate. It is preferable that the base material can be expanded 1% or more from the non-expanded state without being damaged, more preferably expanded 20% or more, and further preferably expanded 75% or more. The stretchable circuit substrate can have the stretchability as a whole by adapting the base material having such a stretchability. Further, the stretchable circuit substrate can be used in products and applications that requires high stretch such that attached to a part of the human body such as arms. In general, it is said a product that is attached to human underarms requires the stretchability of 72% in the vertical direction, and 27% in the horizontal direction. Also, it is said a product that is attached to human knees, elbows, buttocks, ankles, and armpits requires the stretchability of 26% or more and 42% or less in the vertical direction. Also, it is said a product that is attached to other parts of human body requires the stretchability of less than 20%.

Also, it is preferable that the difference between the shape of the base material in non-expanded state and the shape of the base material when it recovered to the non-stretched state again after it is expanded from the non-stretched state, is small. This difference is hereinafter referred to as a change in form in some cases. The change in form of the base material in the area rate can be, for example, 20% or less, is more preferably 10% or less, and further preferably 5% or less. The formation of the bellows-like member becomes easy by adapting the base material with small change in its shape.

The Young's modulus of the base material can be, for example, 10 MPa or less, and is preferably 1 MPa or less. Also, the Young's modulus of the base material can be 1 kPa or more. The stretchable circuit substrate, as a whole, can have the stretchability by adapting the base material having such a Young's modulus.

The method for obtaining the Young's modulus of the base material is in the same manner as in the method for obtaining the Young's modulus of the adjustment layer described above.

The material of the base material shall be the one that is stretchable, and examples thereof include an elastomer, which can be appropriately selected depending on applications of the stretchable circuit substrate. As the elastomer, general thermoplastic elastomers and thermosetting elastomers can be used, and specific examples thereof include a styrene-based elastomer, an olefin-based elastomer, a urethane-based elastomer, an amide-based elastomer, a nitrile-based elastomer, a vinyl-chloride-based elastomer, an ester-based elastomer, a 1,2-polybutadiene-based elastomer, a fluorine-based elastomer, a silicone rubber, a urethane rubber, a fluorine rubber, polybutadiene, polyisobutyrene, polystyrenebutadiene, and polychloroprene. In consideration of mechanical strength and abrasion resistance, the urethane-based elastomer is preferably used. Also, the base material may contain silicone. Silicone is excellent in heat resistance, chemical resistance, and fire resistance, and thus is preferable as the material for the base material. Also, as the material for the base material, for example, fabrics such as non-woven fabric, woven fabric, and knit can be also used.

The thickness of the base material is not particularly limited and is appropriately selected depending on the material of the base material; for example, it can be 10 µm or more, is preferably 20 µm or more, and more preferably 25 µm or more, also, can be 10 mm or less, is preferably 3 mm or less, and more preferably 1 mm or less. The thickness of the base material being the above value or more may secure the durability of the base material. Also, the thickness of the base material being the above value or less secures wearing comfortability of the stretchable circuit substrate. When the thickness of the base material is too thin, the stretchability of the base material is deteriorated in some cases.

Figure 7A:
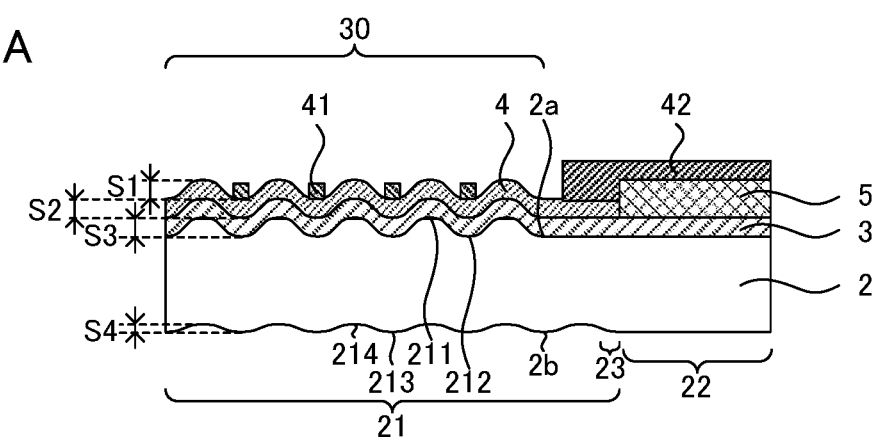
FIGS. 7A and 7B are schematic cross-sectional views illustrating an additional example of the stretchable circuit substrate of the present disclosure.

In FIG. 7A, reference sign S3 signifies the amplitude of ridge 211 and recess 212 appear on a part of the first surface 2a of the base material 2 where the wiring region 21 overlaps with the bellows-like member 30. As shown in FIG. 7A, when the rear surface (the surface facing the base material 2) of the wiring 4 and the first surface 2a of the base material 2 are positioned nearby, the amplitude S3 of the ridge 211 and the recess 212 on the first surface 2a of the base material 2 is almost equal to the amplitude S2 of the bellows-like member 30 on the rear surface of the wiring 4. Also, when the rear surface (the surface facing the base material 2) of the wiring 4 contacts the first surface 2a of the base material 2, the amplitude S3 of the ridge 211 and the recess 212 on the first surface 2a of the base material 2 is almost equal to the amplitude S2 of the bellows-like member 30 on the rear surface of the wiring 4.

FIGS. 1A and 1B show an example in which the bellows-like member does not appear on the second surface 2b of the base material 2, but the embodiment is not limited thereto. As shown in FIG. 7A, the bellows-like member may also appear on the second surface 2b of the base material 2. In FIG. 7A, reference numerical 213 and 214 signify a ridge and a recess appear on the second surface 2b of the base material 2 in the wiring region 21. In the example shown in FIG. 7A, the ridge 213 of the second surface 2b appears at the position that overlaps with the recess 212 of the first surface 2a, and the recess 214 of the second surface 2b appears at the position that overlaps with the ridge 211 of the first surface 2a. Although not illustrated, the position of the ridge 213 and the recess 214 on the second surface 2b of the base material 2 may not overlap the recess 212 and the ridge 211 on the first surface 2a. The number or the cycle of the ridge 213 and the recess 214 on the second surface 2b of the base material 2 may be the same as or different from the number or the cycle of the ridge 211 and the recess 212 on the first surface 2a. For example, the cycle of the ridge 213 and the recess 214 on the second surface 2b of the base material 2 may be larger than the cycle of the ridge 211 and the recess 212 on the first surface 2a. In this case, the cycle of the ridge 213 and the recess 214 on the second surface 2b of the base material 2 may be 1.1 times or more of the cycle of the ridge 211 and the recess 212 on the first surface 2a, may be 1.5 times or more thereof, and may be 2.0 times or more thereof. "The cycle of the ridge 213 and the recess 214 on the second surface 2b of the base material 2 is larger than the period of the ridge 211 and the recess 212 on the first surface 2a" is a concept including the case where the ridge and the recess do not appear on the second surface 2b of the base material 2.

In FIG. 7A, reference sign S4 signifies the amplitude of the ridge 213 and the recess 214 appear on a part of the second surface 2b of the base material 2 where the wiring region 21 overlaps with the bellows-like member 30. The amplitude S4 on the second surface 2b may be the same as or different from the amplitude S3 on the first surface 2a. The amplitude S4 on the second surface 2b may be smaller than the amplitude S3 on the first surface 2a. For example, the amplitude S4 on the second surface 2b may be 0.9 times or less of the amplitude S3 on the first surface 2a, and may be 0.6 times or less. Also, the amplitude S4 on the second surface 2b may be 0.1 times or more of the amplitude S3 on the first surface 2a, and may be 0.2 times or more. When the thickness of the base material 2 is small, the rate of the amplitude S4 on the second surface 2b with respect to the amplitude S3 on the first surface 2a tends to increase. "The amplitude of the ridge 213 and the recess 214 on the second surface 2b of the base material 2 is smaller than the amplitude of the ridge 211 and the recess 212 on the first surface 2a" is a concept including the case where the ridge and the recess do not appear on the second surface 2b of the base material 2.

Figure 7B:
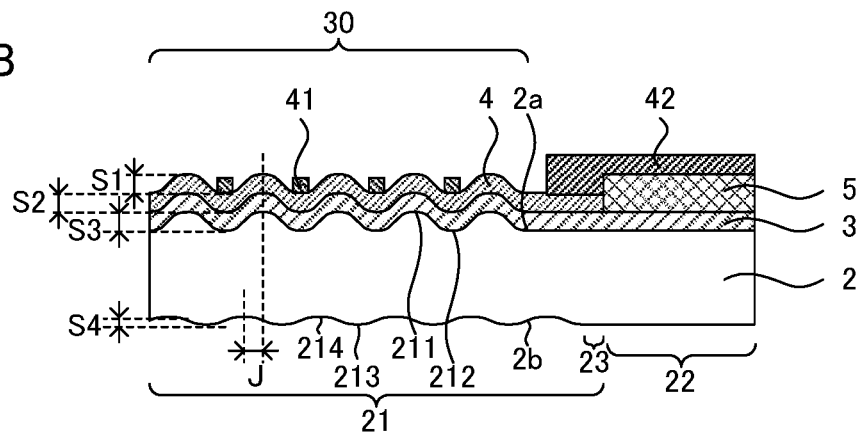

FIG. 7A shows an example in which the positions of the ridge 213 and the recess 214 on the second surface 2b match the positions of the recess 211 and the ridge 212 on the first surface 2a, but the embodiment is not limited thereto. As shown in FIG. 7B, the positions of the ridge 213 and the recess 214 on the second surface 2b may be shifted in just J from the positions of the recess 211 and the ridge 212 on the first surface 2a. The shift amount J is, when F3 designates the cycle of the ridge 211 and the recess 212 appear on the first surface 2a of the base material where overlaps with the bellows-like member 30, for example, 0.1*F3 or more, and may be 0.2*F3 or more.

Figure 8:
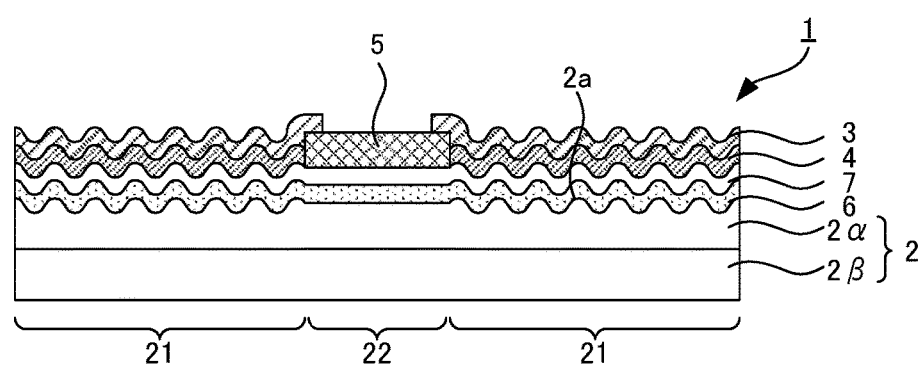
FIG. 8 is a schematic cross-sectional view illustrating an additional example of the stretchable circuit substrate of the present disclosure.

The stretchable circuit substrate of the present embodiment may comprise just one layer of the base material, and may comprise two or more layers of the base material. For example, in FIG. 8, the base material 2 includes a first base material 2α and a second base material 2β in this order from the wiring 4 side. The Young's moduluses of the first base material 2α and the second base material 2β may be the same and may be different. Above all, the Young's modulus of the first base material 2α is preferably smaller than the Young's modulus of the second base material 2β. In this case, the first base material 2α having comparatively small Young's modulus functions as a supporting layer of the adjustment layer, and the second base material 2β having comparatively large Young's modulus functions as a contraction improving layer. The Young's modulus of the first base material 2α can be less than 1 time of the Young's modulus of the second base material 2β, is preferably 0.9 times or less thereof, and more preferably 0.7 times or less thereof. Also, the Young's modulus of the first base material 2a can be 0.01 times or more of the Young's modulus of the second base material 2β, and is preferably 0.05 times or more thereof. Also, for example, when the base material 2β is fabric, the elasticity drops sharply if it exceeds the threshold level; thus, it functions as a limiter that prevents the stretchable circuit substrate from being expanded too much. The materials of the first base material 2α and the second base material 2β may be the same and may be different. The thicknesses of the first base material 2α and the second base material 2β may be the same and may be different. The thickness of the first base material 2a is, for example, preferably larger than the amplitude (S2) of the ridge and the recess appear on the surface of the wiring which faces base material wiring at a part of the wiring region which overlaps with the bellows-like member. Also, the thickness of the first base material 2α is, for example, preferably larger than the amplitude (S3) of the ridge and the recess appear on the first surface of the base material at a part among the wiring region which overlaps with the bellows-like member.

4. Functional Member

The stretchable circuit substrate of the present embodiment may include a functional member which is positioned on the first surface side of the base material, and also positioned in the functional member region which is adjacent to the wiring region and to which a functional member is mounted.

The functional member is appropriately selected depending on the applications of the stretchable circuit substrate; the functional member may be an active element, may be a passive element and may be a mechanical element. Examples of the functional member include a transistor, a LSI (Large-Scale Integration), MEMS (Micro Electra Mechanical Systems), a relay, a light emitting element such as an LED, an OLED or a LCD, a sensor, a sound element such as a buzzer, a vibration element that emits vibration, a cool and heat generating part for controlling the cool and heat generation such as a Peltier element or a heating wiring, a resistor, a capacitor, an inductor, a piezoelectric element, a switch, and a connector.

Among the above, the sensor is preferably used. Examples of the sensor include a temperature sensor, a pressure sensor, a light sensor, a photoelectron sensor, a proximity sensor, a shearing force sensor, a magnetic sensor, a laser sensor, a microwave sensor, a humidity sensor, a distortion sensor, a gyro sensor, an acceleration sensor, a deviation sensor, a gas sensor, a GPS sensor, an ultrasonic wave sensor, an odor sensor, a brain wave sensor, a current sensor, a vibration sensor, a pulse wave sensor, a cardio sensor, and an illuminance sensor. In particular, the sensor is preferably a biosensor that can measure bio-information such as heart rate or pulse rate, cardio, blood pressure, body temperature, blood oxygenation level, myoelectricity, and brain wave.

The functional member is connected to the wiring. Regarding the connection structure of the functional member and the wiring, general structures can be applied.

The surroundings of the functional member can be covered with a resin such as a potting agent in order to reinforce the electronically connected part where the functional member is connected to the wiring. Thereby, mechanical reliability of the electronically connected part of the functional member and the wiring can be improved.

The functional member may and may not include a bellows-like shape; the bellows-like member may be included when the functional member can tolerate the stretch. For example, when the functional member is TFT or OLED, it may include the bellows-like member. The functional member region may and may not have a bellows-like shape. In the latter case, the functional member region is, for example, preferably in a flat shape.

Figure 9A:
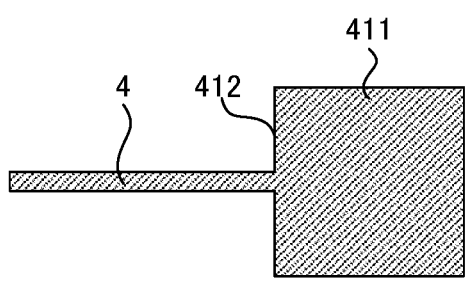
FIGS. 9A and 9B are schematic plan view illustrating an example of the wiring in the stretchable circuit substrate of the present disclosure.
Figure 9B:
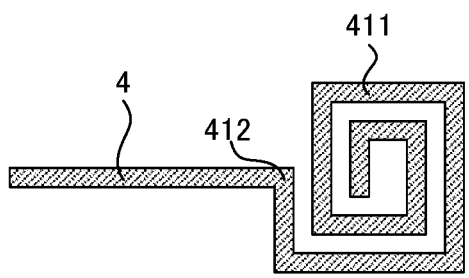

As the functional member, a part of the wiring may be used. In other words, the wiring may include a functional element part. The functional element part may be arranged at, for example, the end part of the wiring, and may be arranged at the middle part of the wiring. In the example shown in FIG. 9A, functional element part 411 has a width wider than that of a routing part (the part other than the functional element part) of the wiring 4. Outer periphery 412 of the functional element part 411 is the part where width changes. The functional element part 411 shown in FIG. 9A may, for example, functions as a pad. To the pad, for example, a probe for inspection or a terminal for rewriting software may be connected. FIG. 9B is a plan view illustrating an additional example of the functional element part 411. In the example shown in FIG. 9B, the functional element part 411 has a shape that extends in a spiral shape. The outer periphery 412 of the functional element part 411 is the part where the spiral shape starts to extend. An electrode part including a specific pattern as shown in FIG. 9B may function as, for example, an antenna and a pressure sensor.

5. Supporting Base Material

The stretchable circuit substrate of the present embodiment may include a supporting base material between the base material and the wiring. Also, when the stretchable circuit substrate of the present embodiment comprises the functional member, the supporting base material can be included between the base material and the wiring as well as the functional member. The supporting base material is a member that supports the wiring and the functional member. FIGS. 3A to 3D are examples in which the stretchable circuit substrate includes the supporting base material 7 between the base material 2 and the wiring 4 as well as the functional member 5.

When the supporting base material is positioned between the base material and the wiring, in the production method of the stretchable circuit substrate of the present embodiment, the bellows-like member is formed on the supporting base material and the wiring when the base material bonded to the supporting base material is contracted by releasing the tensile stress. The characteristics and the size of the supporting base material are designed so as to easily form such a bellows-like member.

The supporting base material has, for example, a Young's modulus larger than the Young's modulus of the base material. The Young's modulus of the supporting base material can be, for example, 100 Mpa or more, and is preferably 1 GPa or more. Also, the Young's modulus of the supporting base material can be, for example, 100 times or more and 50000 times or less of the Young's modulus of the base material, and is preferably 1000 times or more and 10000 times or less thereof. The Young's modulus of the supporting base material is designed in this manner, and thus the period of the bellows-like member may be prevented from being too small. Also, it may inhibit the generation of a local bend in the bellows-like member. Also, if the Young's modulus of the supporting base material is too large, the base material would have difficulty recovering when it is relaxed, and a crack and a bend would be easily generated in the base material. Also, as described later, when the stretchable circuit substrate of the present embodiment comprises a plurality of the stretch controlling part positioned in the wiring region and arranged along with the first direction in which the ridges and the recesses of the bellows-like member continuously appear, if the Young's modulus of the supporting base material is too small, the supporting base material would easily change its form during the step of forming the stretch controlling part; as a result, the stretch controlling part would have difficulty matching its position to the wiring and the functional member.

Also, the Young's modulus of the supporting base material may be 100 times or less of the Young's modulus of the base material.

Incidentally, the method for obtaining the Young's modulus of the supporting base material is in the same manner as in the method for obtaining the Young's modulus of the adjustment layer described above.

The supporting base material usually includes a bellows-like member. The bellows-like member may be the same as the bellows-like member included in the wiring described above.

The supporting base material may be the one that tolerate the stretch, and examples thereof may include a resin base material. Specific examples of the material constituting the resin base material may include polyester such as polyethylene naphthalate and polyethylene terephthalate, polyimide, polyamide, polycarbonate, polyolefin, a cycloolefin polymer, and an acrylic resin. Among them, polyethylene naphthalate or polyimide is preferably used since their durability and heat resistance are good.

The thickness of the supporting base material may be a thickness which can be stretched when the bellows-like member is included; for example, it may be 500 nm or more, and is preferably 1 μm or more, also, may be 10 μm or less, and is preferably 5 μm or less. If the thickness of the supporting base material is too thin, it would be difficult to handle the supporting base material in the step of producing the supporting base material and in the step of forming a member on the supporting base material. Also, if the thickness of the supporting base material is too thick, the base material would have difficulty recovering during being relaxed, and the intended stretch of the base material may not be obtained in some cases.

An adhesive layer may be arranged between the supporting base material and the base material.

Incidentally, below, the adhesive layer positioned between the supporting base material and the base material may be referred to as a second adhesive layer in some cases.

There are no particular limitations on the second adhesive layer and general adhesives and pressure sensitive adhesives used for circuit substrates may be used.

The second adhesive layer usually includes a bellows-like member. The bellows-like member may be the same as the bellows-like member included in the wiring described above.

The thickness of the second adhesive layer may be a thickness which is stretchable and with which the supporting base material can be attached to the first surface side of the base material; for example, it may be in a range of 5 μm or more and 200 μm or less, and is preferably in a range of 10 μm or more and 100 μm or less.

Also, the second adhesive layer may be a molecule adhesive layer. In the present disclosure, the base material and the supporting base material may be adhesively bonded with chemical bonding using the molecule adhesive.

The molecule adhesive layer may be the same as that described for the first adhesive layer above.

Examples of the method for arranging the molecule adhesive layer may include a method in which the first surface of the base material, and the surface of the supporting base material which is opposite side surface to the wiring and the functional member side surface, are surface-modified with the molecule adhesive.

6. First Stretch Controlling Part

The stretchable circuit substrate of the present embodiment may comprise a plurality of a stretch controlling part which is positioned on the first surface side of the base material, the second surface side of the base material, or inside the base material, as well as in the wiring region, and arranged along with the first direction in which the ridges and the recesses of the bellows-like member continuously appear. Incidentally, below, this stretch controlling part may be referred to as a first stretch controlling part in some cases.

The first stretch controlling part is a member arranged for controlling the stretch of the base material.

Figure 10A:
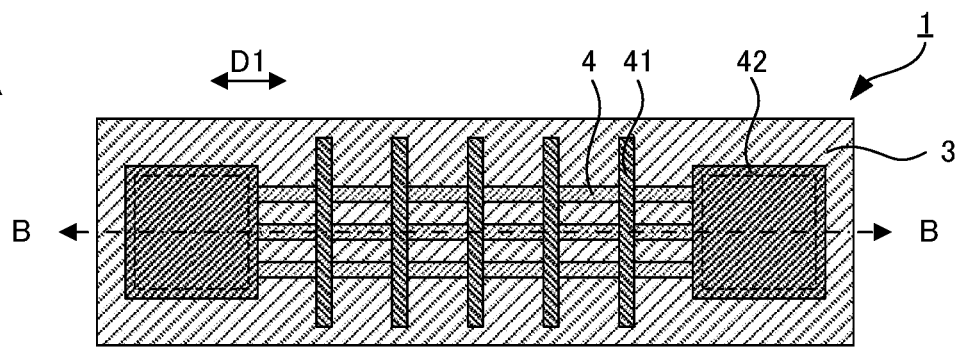
FIGS. 10A and 10B are a schematic plan view and a cross-sectional view illustrating an example of the stretchable circuit substrate.
Figure 10B:
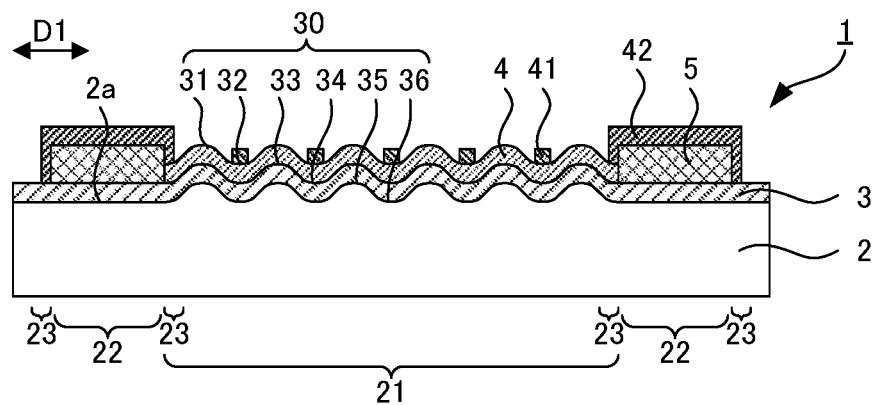

FIGS. 10A and 10B are a schematic plan view and a cross-sectional view illustrating an additional example of the stretchable circuit substrate of the present embodiment, and FIG. 10B is a cross-sectional view of B-B line in FIG. 10A. As shown in FIGS. 10A and 10B, the stretchable circuit substrate 1 may comprise a plurality of the first stretch controlling part 41 which is positioned in the wiring region 21, and arranged along with the first direction D1 in which the ridges 31, 33, 35 and the recesses 32, 34, 36 of the bellows-like member 30 continuously appear. In FIGS. 10A and 10B, the first stretch controlling part 41 is positioned on the first surface 2a side of the base material 2, and also positioned on the surface of the wiring 4 which is opposite side surface to the base material 2 side surface, and on the surface of the adjustment layer 3 which is opposite side surface to the base material 2 side surface.

The first stretch controlling part is arranged in the wiring region, and thus structures such as the period and the amplitude of the bellows-like member may be controlled. Accordingly, generation of a local large curve and bend in the wiring can be inhibited. Thereby, the damage of the wiring can be inhibited.

Figure 11:
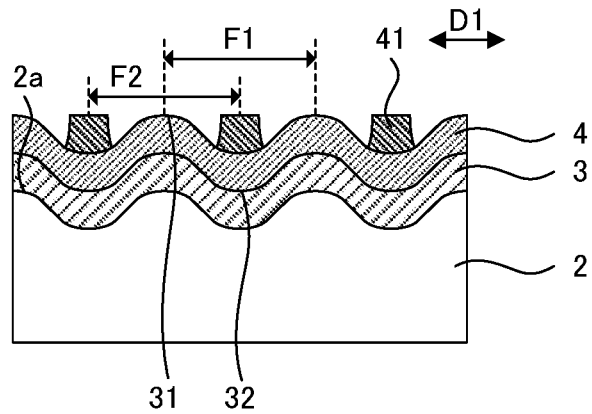
FIG. 11 is a schematic cross-sectional view illustrating an additional example of the stretchable circuit substrate of the present disclosure.

FIG. 11 is an enlarged view of the wiring region in FIG. 10B. As shown in FIG. 11, in the wiring region, in the in-plane direction of the first surface 2a of the base material 2, a plurality of the first stretch controlling part 41 is arranged in period F2, along with the first direction D1 in which the ridge 31 and the recess 32 continuously appear. Thus, in the base material 2, a part that easily stretches and a part not easily stretches are continuously present in the period F2 along with the direction to which the wiring 4 extends. In this case, when the base material 2 is relaxed, the bellows-like member 30 having the period F1 that corresponds to the period F2 of the first stretch controlling part 41 may be easily generated in the wiring 4. In other words, the period F1 of the bellows-like member 30 may be controlled by the first stretch controlling part 41.

Below, advantages of controlling the period of the bellows-like member will be described. When a plurality of the first stretch controlling part is arranged in the period F2 along with the first direction in which the bellows-like member appears, the period F1 of the bellows-like member appears in the wiring may be controlled. Thereby, it is possible to inhibit the height of the ridge in the bellows-like member from becoming locally large due to the period F1 of the bellows-like member being disordered. Accordingly, it is possible to inhibit the wiring from being damaged due to large stress to the wiring.

Incidentally, the period of the bellows-like member signifies an average value of the distances between a plurality of the ridges in the bellows-like member, in the first direction. Also, the period of the first stretch controlling part signifies an average value of the distances between a plurality of the first stretch controlling part, in the first direction. Incidentally, below, the period of the bellows-like member may be referred to as a first period, and the period of the first stretch controlling part may be referred to as a second period in some cases.

If the control of the first period in the bellows-like member by the first stretch controlling part is appropriately achieved, the first stretch controlling part would be arranged in the second period that corresponds to the first period of the bellows-like member. In the example shown in FIG. 11, the second period F2 of the first stretch controlling part 41 is equal to the first period F1 of the bellows-like member. In this case, the first stretch controlling part 41 is positioned at the part of specific phase in the bellows-like member; for example, it is positioned at the ridge 32 in the bellows-like member. A plurality of the first stretch controlling part is preferably arranged in the period corresponding to the period of the bellows-like member.

Incidentally, the first period of the bellows-like member that appears in the wiring arranged on the base material may not match the second period of the plurality of the first stretch controlling part in some cases, depending on the Young's modulus and the thickness of the base material. For example, there may be both cases the second period of the first stretch controlling part is larger than the first period of the bellows-like member, and is smaller than the first period of the bellows-like member. In both cases, the part where the first stretch controlling part is arranged among the wiring region would easily be the part of the specific phase in the bellows-like member. For example, the part where the first stretch controlling part is arranged in the base material may be the ridge or the recess of the bellows-like member. Thereby, it is possible to inhibit the first period of the bellows-like member from being disordered; thus, it is possible to inhibit the height of the ridge in the bellows-like member from becoming locally large.

In this manner, the plurality of the first stretch controlling part may attain the roll of controlling the first period of the bellows-like member generated in the wiring.

The second period of the first stretch controlling part may be, for example, m times or 1/n of the first period of the bellows-like member. Here, "m" and "n" are a positive integer. It is preferable that "m" is 3 or less and "n" is 4 or less. The second period of the first stretch controlling part may be, for example, 5 μm or more and 10 mm or less.

The Young's modulus of the first stretch controlling part may be larger than the Young's modulus of the base material, and may be equal or less than the Young's modulus of the base material.

When the Young's modulus of the first stretch controlling part is larger than the Young's modulus of the base material, the Young's modulus of the first stretch controlling part may be, for example, 10 GPa or more and 500 GPa or less, and is preferably 1 GPa or more and 300 GPa or less. If the Young's modulus of the first stretch controlling part is too small, it may be difficult to control the stretch in some cases. Also, when the Young's modulus of the first stretch controlling part is too large, damage of the structure such as a crack and a line in the first stretch controlling part may occur in some cases when the base material is stretched.

In this case, the Young's modulus of the first stretch controlling part may be, for example, 1.1 times or more and 5000 times or less of the Young's modulus of the base material, and is preferably 10 times or more and 3000 times or less thereof. Arrangement of such a first stretch controlling part in the base material may inhibit the stretch of the part where the base material overlaps the first stretch controlling part in a plan view. Thus, the base material may be divided into a part easily stretches and a part not easily stretches. Thereby, structures such as the period and the amplitude of the bellows-like member appears in the base material may be controlled.

Incidentally, the method for obtaining the Young's modulus of the first stretch controlling part is the same as for the case of the adjustment layer described above.

When the Young's modulus of the first stretch controlling part is larger than the Young's modulus of the base material, as the material constituting the first stretch controlling part, a metal material may be used. Examples of the metal material may include copper, aluminium, and stainless steel. Also, as the material constituting the first stretch controlling part, general thermoplastic elastomer, acrylic, urethane-based, epoxy-based, polyester-based, vinylether-based, polyen-thiol-based, or silicone-based oligomer and polymer may be used as well.

The thickness of the first stretch controlling part may be, for example, 1 µm or more and 100 µm or less.

Also, when the Young's modulus of the first stretch controlling part is equal to or less than the Young's modulus of the base material, the Young's modulus of the first stretch controlling part may be, for example, 10 MPa or less, and may be 1 MPa or less. Also, the Young's modulus of the first stretch controlling part may be, for example, 1 time or less of the Young's modulus of the base material, and may be 0.8 times or less thereof. In this case, the amplitude of the bellows-like member appears in the base material would be larger than that when the Young's modulus of the first stretch controlling part is larger than the Young's modulus of the base material, and thus the stretchability of the stretchable circuit substrate would also be larger. Also, even when the Young's modulus of the first stretch controlling part is equal to or less than the Young's modulus of the base material, there may be difference in the stretchability between the part where the base material overlaps the first controlling part in a plan view, and the part where the base material does not overlap the first controlling part in a plan view. In other words, the base material may be divided into the part easily stretches and the part not easily stretches. Thereby, structures such as the period and the amplitude of the bellows-like member appears in the base material may be controlled.

When the Young's modulus of the first stretch controlling part is equal to or less than the Young's modulus of the base material, as a material constituting the first stretch controlling part, general thermoplastic elastomers and thermosetting elastomers may be used, and examples thereof may include a styrene-based elastomer, an acrylic elastomer, an olefin-based elastomer, a urethane-based elastomer, a silicone rubber, a urethane rubber, a fluorine rubber, a nitrile rubber, polybutadiene, and polychloroprene.

The thickness of the first stretch controlling part may be, for example, 1 µm or more and 100 µm or less.

Also, the characteristics of the first stretch controlling part may be expressed with bending rigidity instead of the Young's modulus. In other words, the bending rigidity of the first stretch controlling part may be larger than the bending rigidity of the base material, and may be equal to or less than the bending rigidity of the base material.

Incidentally, the cross-sectional secondary moment of the first stretch controlling part may be calculated based on a cross-section obtained by cutting the first stretch controlling part in a plane orthogonal to the stretch direction of the stretchable circuit substrate.

When the bending rigidity of the first stretch controlling part is larger than the bending rigidity of the base material, the bending rigidity of the first stretch controlling part may be, for example, 1.1 times or more of the bending rigidity of the base material, is preferably 2 times or more thereof, and further preferably 10 times or more thereof.

Also, when the bending rigidity of the first stretch controlling part is equal to or less than the bending rigidity of the base material, the bending rigidity of the first stretch controlling part may be, for example, 1 times or less of the bending rigidity of the base material, and may be 0.8 times or less thereof.

The first stretch controlling part may have uniform deformation properties, and may be configured so as to show different deformation depending on positions. For example, when the first stretch controlling part has uniform thickness, it may have uniform deformation properties. Also, the first stretch controlling part may include a first part, and a second part that has higher deformation properties than that of the first part; in this case, the first stretch controlling part may be configured so as to show different deformation depending on positions.

Figure 12A:
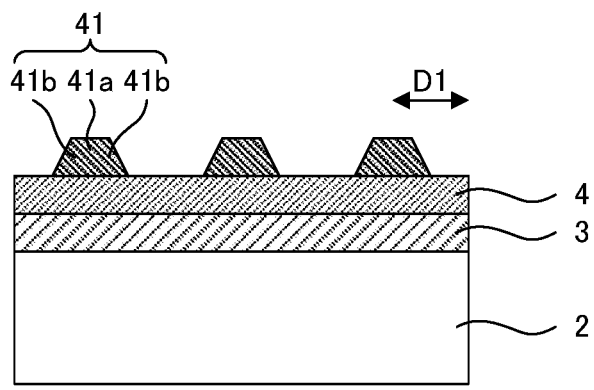
FIGS. 12A and 12B are schematic cross-sectional views illustrating an additional example of the stretchable circuit substrate of the present disclosure.
Figure 12B:
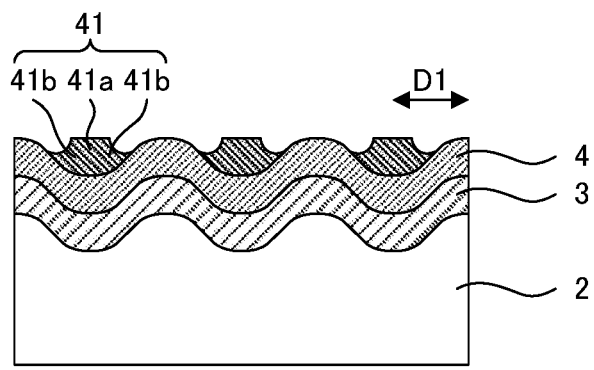

In the first controlling part 41, for example, as shown in FIGS. 12A and 12B, the first part 41a may constitute the central part of the first stretch controlling part 41 in the first direction D1, and the second part 41b may constitute the both edges of the first stretch controlling part 41 in the first direction D1. In other words, the first stretch controlling part 41 may include the first part 41a, and a pair of the second part 41b interposing the first part 41a. Incidentally, FIG. 12A is a cross-sectional view showing the stretchable circuit substrate in a stretched state, and FIG. 12B is a cross-sectional view showing the stretchable circuit substrate shown in FIG. 12A in a relaxed state.

Also, although not illustrated, in the first stretch controlling part, the second part may constitute the central part of the first stretch controlling part, and the first part may constituted the both edges of the first stretch controlling part.

The thickness of the second part in the first stretch controlling part may be thinner than the thickness of the first part. Also, the thickness of the second part may, at least partially, reduced along with distanced from the first part. In the example shown in FIG. 12A, the thickness of the second part 41b monotonously reduces along with distanced from the first part 41a side. In this case, the deformation properties of the wiring region in the base material would be higher along with the direction toward the edge of the first stretch controlling part. As a result, as shown in FIG. 12B, the central part of the first stretch controlling part 41, which is the first part 41a here, would be easily the part of the specific phase in the bellows-like member such as a recess. Also, the first part easily changes its form to follow the shape of the ridge or the recess in the bellows-like member. Thereby, the deformation properties and the stretchability of the wiring region in the base material may be maintained while the stability of the period of the bellows-like member is secured with the central part of the first stretch controlling part.

Figure 13A:
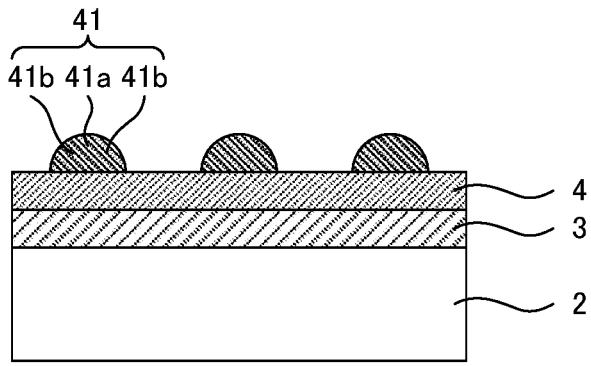
FIGS. 13A to 13D are schematic cross-sectional views illustrating an additional example of the stretchable circuit substrate of the present disclosure.

The first stretch controlling part 41 may, for example, as shown in FIG. 13A, have a shape of hemisphere. In this case, the thickness of the first stretch controlling part around its edge gradually reduces towards the edge. Accordingly, the above described first part and second part may be configured in the first stretch controlling part.

In this case also, the first part in the first stretch controlling part would easily be the part of the specific phase in the bellows-like member. Also, the second part in the first stretch controlling part easily changes its form to follow the shape of the ridge or the recess in the bellows-like member. Thereby, the deformation properties and the stretchability of the wiring region in the base material may be maintained while the stability of the period of the bellows-like member is secured.

Figure 13B:
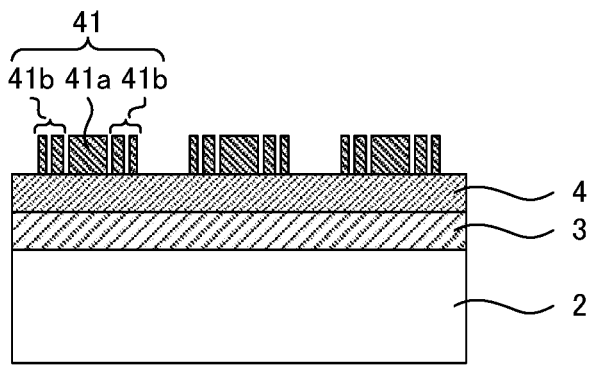

In the first stretch controlling part, for example, as shown in FIG. 13B, the distribution density of the second part 41b in the first stretch controlling part 41 may be smaller than the density distribution of the first part 41a in the first stretch controlling part 41. In the example shown in FIG. 13B, the second part 41b includes a plurality of members arranged with a space between each other. Also, the density distribution of the second part may be gradually smaller along with distanced from the first part. For example, the width of the plurality of members configured in the second part may be gradually smaller along with distanced from the first part, and also, the space between the plurality of members configured in the second part may be gradually larger along with distanced from the first part. Each member in the second part is, for example, configured by the member same as that in the first part.

In this case also, the deformation properties of the wiring region in the base material would be higher in the second part of the first stretch controlling part compared to that in the first part. Thus, the first part would easily be the part of the specific phase in the bellows-like member. Also, the second part easily changes its form to follow the shape of the ridge or the recess of the bellows-like member. Thereby, the deformation properties and the stretchability of the wiring region in the base material may be maintained while the stability of the period of the bellows-like member is secured.

Figure 13C:
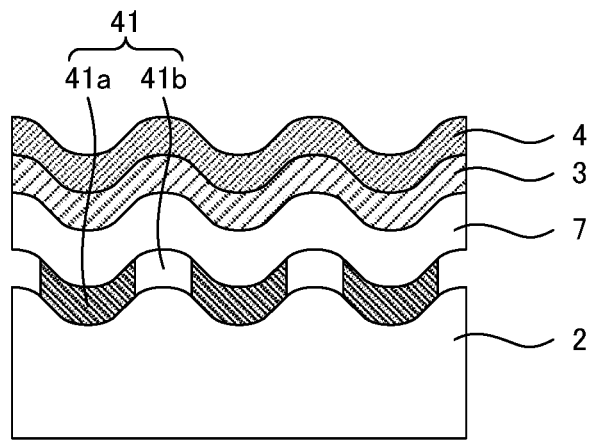

Also, when the stretchable circuit substrate of the present embodiment comprises the supporting base material between the base material and the wiring, in the first stretch controlling part, for example, as shown in FIG. 13C, the second part 41b in the first stretch controlling part 41 may be configured as a space part between the supporting base material 7 and the base material 2. In this case, the first part 41a in the first stretch controlling part 41 may be configured by a member that can function as an adhesive for adhering the supporting base material 7 to the base material 2. The deformation properties of the second part 41b are higher than the deformation properties of the first part 41a since no member is present in the second part 41b. Accordingly, the first part 41a would easily be the part of the specific phase in the bellows-like member. Also, the second part 41b does not interfere the generation and deformation of the bellows-like member. Thereby, the deformation properties and the stretchability of the wiring region in the base material may be maintained while the stability of the period of the bellows-like member is secured.

In the first stretch controlling part, the Young's modulus of the second part may be smaller than the Young's modulus of the first part. In this case, the deformation properties of the wiring region in the base material would be higher in the second part of the first stretch controlling part compared to the first part. Accordingly, the first part would easily be apart of the specific phase in the bellows-like member. Also, the second part would easily change its form to follow the shape of the ridge or the recess in the bellows-like member. Thereby, the deformation properties and the stretchability of the wiring region in the base material may be maintained while the stability of the period of the bellows-like member is secured.

Also, when the stretchable circuit substrate of the present embodiment comprises the supporting base material between the base material and the wiring, and when the first stretch controlling part is positioned between the supporting base material and the base material, the first stretch controlling part may be configured so as the Young's modulus of the second part in the first stretch controlling part becomes smaller than the Young's modulus of the first part. In this case, the first stretch controlling part may be configured by a member that can function as an adhesive for adhering the supporting base material to the base material.

Figure 13D:
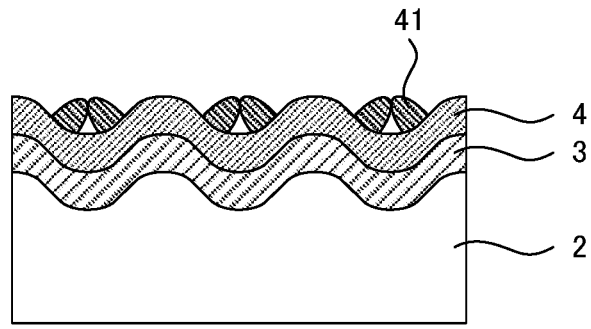

As the first stretch controlling part, for example, as shown in FIG. 13D, at least two of the first stretch controlling part 41 may be positioned in the range of the first period of the bellows-like member and may contact with each other. In this case, when the height of the ridge in the bellows-like member is about to made expanded, the first stretch controlling parts contacting with each other would be compressed and repulsive force occurs. Thereby, it is possible to inhibit the expansion in the height of the ridge in the bellows-like member in which the first stretch controlling parts contacting with each other are arranged.

The first stretch controlling part may be positioned on the first surface side of the base material, may be positioned on the second surface side of the base material, and may be positioned inside the base material.

Figure 14A:
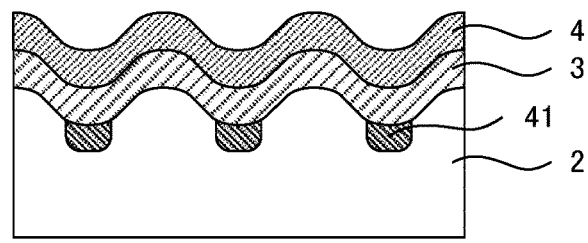
FIGS. 14A to 14E are schematic cross-sectional views illustrating an additional example of the stretchable circuit substrate of the present disclosure.

When the first stretch controlling part is positioned on the first surface side of the base material, the first stretch controlling part 41 may be, for example, positioned on the surface of the wiring 4 which is opposite side surface to the base material 2 side surface as shown in FIG. 11, and may be positioned between the base material 2 and the wiring 4 as shown in FIG. 14A. When the first stretch controlling part is positioned between the base material and the wiring, the first stretch controlling part may be positioned on the first surface of the base material, and may be positioned in a concave part designed on the first surface of the base material. Also, when the stretchable circuit substrate of the present embodiment comprises the supporting base material between the base material and the wiring, the first stretch controlling part may be positioned on the surface of the wiring which is opposite side surface to the supporting base material side surface, and may be positioned between the supporting base material and the wiring.

Figure 14B:
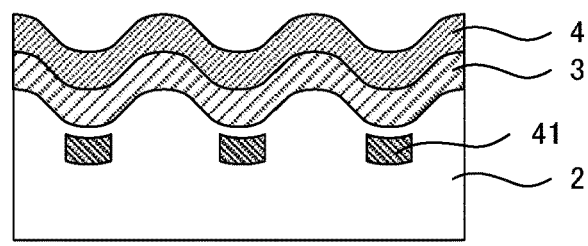

When the first stretch controlling part is positioned inside the base material, for example, as shown in FIG. 14B, the first stretch controlling part 41 is embedded inside the base material 2. Such a base material and a first stretch controlling part may be obtained by, for example, injecting the first stretch controlling part at an appropriate timing into a mold when the base material is fabricated by pouring a resin into the mold and the resin in the mold is solidified.

Figure 14C:
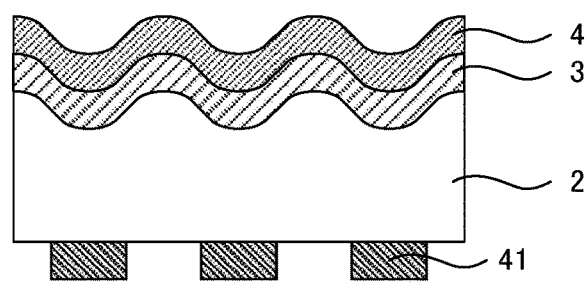
Figure 14D:
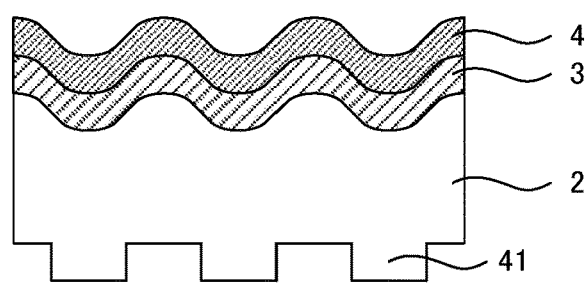
Figure 14E:
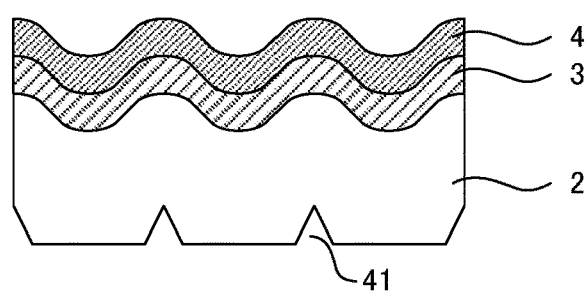

When the first stretch controlling part is positioned on the second surface side of the base material, the first stretch controlling part 41 may be, for example, configured separately from the base material 2 as shown in FIG. 14C, and may be configured integrally with the base material 2 as shown in FIGS. 14D and 14E. Also, when the first stretch controlling part is configured integrally with the base material, the first stretch controlling part 41 may be, for example, may be a convex part designed in the base material 2 as shown in FIG. 14B, and may be a concave part designed in the base material 2 as shown in FIG. 14C. Incidentally, "integrally" means that there is no interface between the base material and the first stretch controlling part.

When the first stretch controlling part configured with the concave part is arranged in the base material also, parts easily stretch and parts not easily stretch would continuously appear in the wiring region of the base material along with the direction to which the wiring extends. Thereby, it is possible to inhibit the height of the ridge in the bellows-like member from becoming locally large due to the period of the bellows-like member being disordered. Accordingly, it is possible to inhibit the wiring from being damaged due to large stress to the wiring.

Figure 15A:
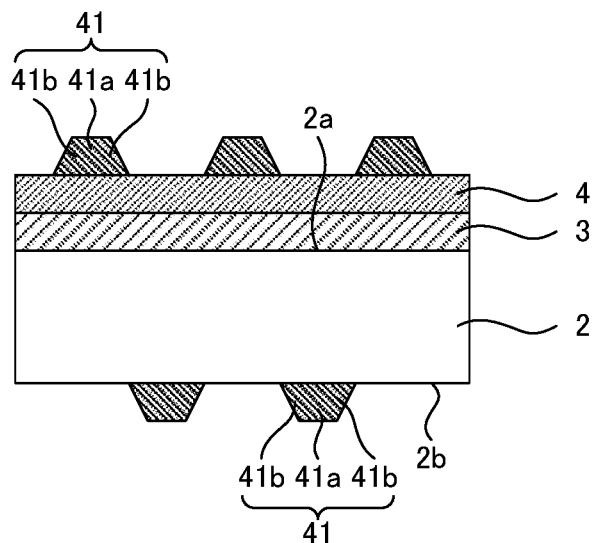
FIGS. 15A and 15B are schematic cross-sectional views illustrating an additional example of the stretchable circuit substrate of the present disclosure.
Figure 15B:
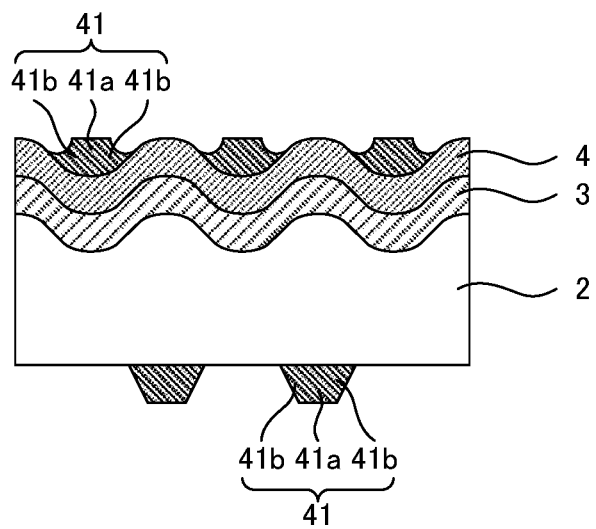

The first stretch controlling part 41 may be, for example, as shown in FIGS. 15A and 15B, arranged on both of the first surface 2a side and the second surface 2b side of the base material 2. In this case, as shown in FIG. 15A, the first stretch controlling part 41 may be positioned so as the first part 41a of the first stretch controlling part 41 positioned on the first surface 2a side of the base material 2 does not overlap with the first part 41a of the first stretch controlling part 41 positioned on the second surface 2b side of the base material 2 in a plan view. Incidentally, FIG. 15A is a cross-sectional view illustrating the stretchable circuit substrate in a stretched state, and FIG. 15B is a cross-sectional view illustrating the stretchable circuit substrate in the FIG. 15B is in a relaxed state. In the example shown in FIG. 15B, the first stretch controlling part 41 positioned on the first surface 2a side of the base material 2 corresponds to the recess in the bellows-like member, and the first stretch controlling part 41 positioned on the second surface 2b side of the base material 2 corresponds to the ridge in the bellows-like member.

Figure 16A:
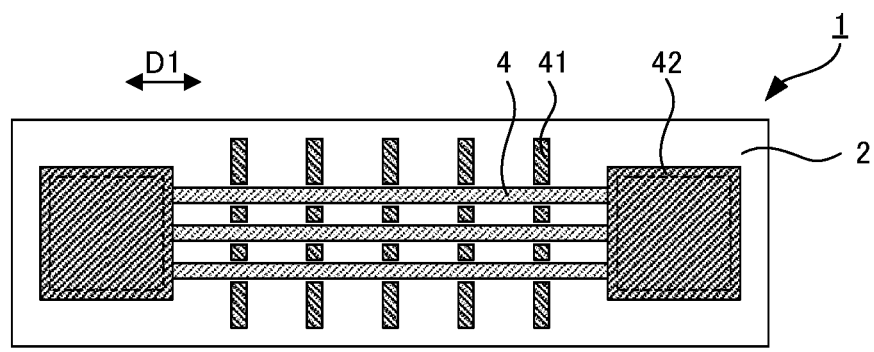
FIGS. 16A to 16C are schematic plan views illustrating an additional example of the stretchable circuit substrate of the present disclosure.

The first stretch controlling part 41 may be, for example, positioned so as to overlap the wiring 4 in a plan view as shown in FIG. 10A, and may be positioned so as not to overlap the wiring 4 in a plan view as shown in FIG. 16A. Incidentally, in FIG. 16A, the adjustment layer is omitted.

When the first stretch controlling part does not overlap the wiring in a plan view, the first stretch controlling part and the wiring may be positioned in the same plane. Even when the first stretch controlling part does not overlap the wiring in a plan view, it is possible to inhibit the height of the ridge in the bellows-like member from becoming locally large due to the period of the bellows-like member being disordered if a plurality of the first stretch controlling part is arranged along with the first direction where the bellows-like member appears. Accordingly, it is possible to inhibit the wiring from being damaged due to large stress to the wiring. Incidentally, when the first stretch controlling part and the wiring are positioned in the same plane, the both may be simultaneously formed in the same step.

Figure 16B:
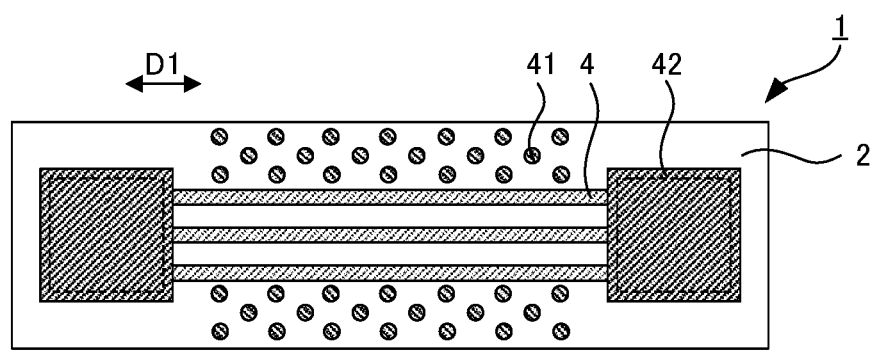
Figure 16C:
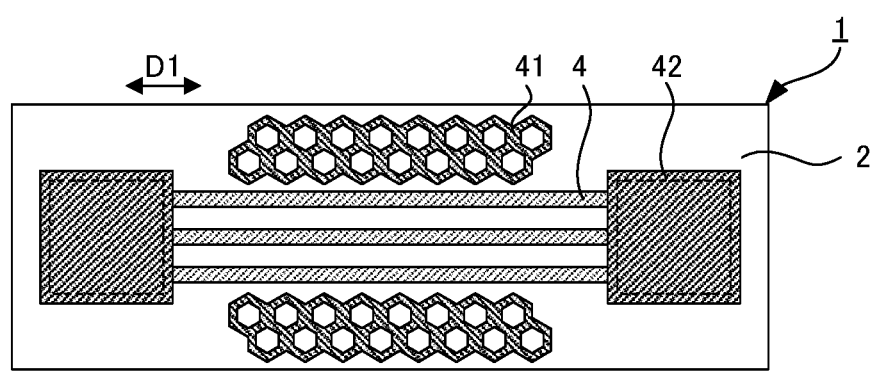

There are no particular limitations on the shape of the first stretch controlling part in a plan view. For example, as shown in FIG. 10A, the first stretch controlling part 41 may extends to the direction crossing the first direction D1 where the bellows-like member appears, such as to the direction orthogonal to D1. The first stretch controlling part 41 may have a circle shape as shown in FIG. 16B, and the first stretch controlling part 41 may have a honeycomb shape as shown in FIG. 16C. Incidentally, in FIGS. 16B and 16C, the adjustment layer is omitted. When the first stretch controlling part has the circle shape, the circle shape may be in a shape of a perfect circle, and may be in a shape of oval.

The circle shape and the honeycomb shape are isotropic shapes comparing to a square shape. For this reason, isotropic expansion may be generated at the part where the first stretch controlling part overlaps with the base material in a plan view and around that part, when a force such as tensile stress is applied to the base material.

The method for forming the first stretch controlling part may be appropriately selected depending on factors such as materials. Examples of the method may include a method in which a metal film is formed on the base material or on the supporting base material with means such as a vapor deposition method and a spattering method, and then the metal film is subjected to patterning using a photolithography method. Also, examples of the method may include a method in which a resin film such as an organic layer is formed entirely on the base material or on the supporting base material by methods such as a coating method using means such as a spin coating method, and then the resin film is subjected to patterning using a photolithography method. Also, examples of the method may include a method in which the material of the first stretch controlling part is printed on the base material or on the supporting base material in a pattern using a general printing method. Among these methods, the printing method, with which material efficiency is good and production is inexpensive, is preferably used.

7. Second Stretch Controlling Part

The stretchable circuit substrate of the present embodiment may comprise a second stretch controlling part positioned on the first surface side of the base material, on the second surface side of the base material, or inside the base material. The second stretch controlling part may be positioned in the functional member surrounding region which is positioned around the functional member region, and may be extended to the border between the functional member surrounding region and the functional member region.

As shown in FIGS. 10A and 10B, the stretchable circuit substrate 1 may comprise the second stretch controlling part 42 which is positioned in the functional member surrounding region 23 positioned around the functional member region 22, and which extends to the border between the functional member surrounding region 23 and the functional member region 22. In FIGS. 10A and 10B, the second stretch controlling part 42 extends to the functional member region 22 exceeding the border between the functional member surrounding region 23 and the functional member region 22, and is positioned in the entire region of the functional member region 22. Also, the second stretch controlling part 42 is positioned on the first surface 2a side of the base material 2, as well as positioned on the surface of the functional member 5 which is opposite side surface to the base material 2 side surface and on the surface of the adjustment layer 3 which is opposite side surface to the base material 2 side surface.

The second stretch controlling part is arranged in the functional member surrounding region, and also, the second stretch controlling part extends to the border between the functional member surrounding region and the functional member region, and thus generation of the large ridge in the wiring near the functional member can be inhibited. Thereby, the damage of the electronically connected part between the functional member and the wiring can be inhibited.

Incidentally, configurations such as Young's modulus, bending rigidity, material, and thickness of the second stretch controlling part may be the same as those of the first stretch controlling part described above.

The Young's modulus of the first stretch controlling part and the Young's modulus of the later described second stretch controlling part may be equal. In this case, the first stretch controlling part and the second stretch controlling part may be simultaneously formed in the same step, and thus the step of forming the first stretch controlling part would be convenient.

Also, the Young's modulus of the first stretch controlling part and the Young's modulus of the second stretch controlling part may be different. In this case, it is preferable that the Young's modulus of the second stretch controlling part is larger than the Young's modulus of the first stretch controlling part.

When E1 designates the Young's modulus of the base material, E21 designates the Young's modulus of the second stretch controlling part, and E22 designates the Young's modulus of the first stretch controlling part, examples of the combination are as follows:

Example 1: $E1 < E21 = E22$;

Example 2: $E1 < E22 < E21$;

$E22 \leq E1 < E21$; and     Example 3:

$E21 = E22 \leq E1$.     Example 4:

The thickness and the material of the first stretch controlling part and the thickness and the material of the second stretch controlling part may be the same. In this case, the step of forming the first stretch controlling part would be convenient.

Also, the material and the thickness of the first stretch controlling part and the material and the thickness of the second stretch controlling part may be different. In this case, it is preferable that the thickness of the second stretch controlling part is thinner than the thickness of the first stretch controlling part. This is because the functional member is thicker than the wiring in general. When the thickness of the second stretch controlling part is thinner than the thickness of the first stretch controlling part, the concave, convex, and step in between the wiring region and the functional member region may be small. Thereby, it is possible to inhibit an element from being peeled off by being hooked. Also, discomfort when a user put on an electronic device provided with the stretchable circuit substrate can be reduced.

Figure 17A:
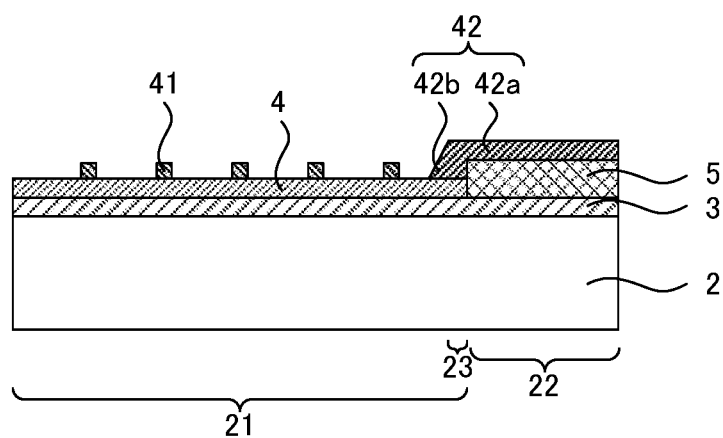
FIGS. 17A and 17B are schematic cross-sectional views illustrating an additional example of the stretchable circuit substrate of the present disclosure.
Figure 17B:
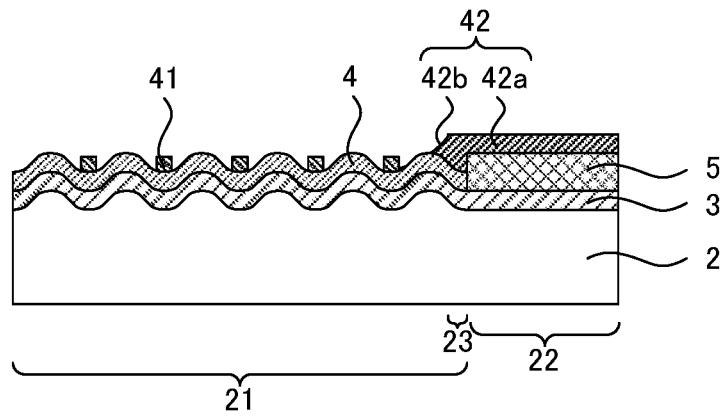

The second stretch controlling part may have uniform deformation properties, and may be configured so as to show different deformation properties depending on positions. For example, when the second stretch controlling part has a uniform thickness, it may have uniform deformation properties. Also, the second stretch controlling part may include a first part, and a second part having higher deformation properties than that of the first part; in this case, the second stretch controlling part may be configured so as to show different deformation properties depending on positions. For example, in examples shown in FIGS. 17A and 17B, the second stretch controlling part 42 includes the first part 42a, and the second part 42b having higher deformation properties than that of the first part 42a, and the second part 42b is positioned in the wiring region 21 side with respect to the first part 42a. Incidentally, FIG. 17A is a cross-sectional view illustrating the stretchable circuit substrate in a stretched state, and FIG. 17B is a cross-sectional view illustrating the stretchable circuit substrate shown in FIG. 17A in a relaxed state.

The thickness of the second part in the second stretch controlling part may be thinner than the thickness of the first part. Also, the thickness of the second part may be, at least partially, reduced gradually towards the wiring region side. In the example shown in FIG. 17A, the thickness of the second part 42b in the second stretch controlling part 42 is monotonously reduced gradually from the first part 42a side toward the wiring region 21 side. In this case, the deformation properties of the functional member surrounding region 23 in the base material 2 would be higher along with the direction towards the wiring region 21. Accordingly, it is possible to inhibit the deformation properties of the base material 2 from dramatically changing in the border between the functional member region 22 and the wiring region 21, or near that region. Thus, as shown in FIG. 7B, a deformation that matches the bellows-like member appears in the wiring region 21 may be generated in the base material 2 and the wiring 4 positioned in the functional member region 23 when the stretchable circuit substrate 1 is relaxed. Thereby, it is possible to inhibit the damage of the wiring in the border between the functional member region and the wiring region or near that region.

Figure 18A:
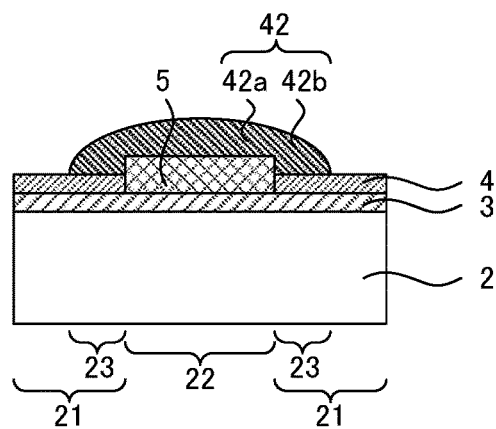
FIGS. 18A to 18D are schematic cross-sectional views illustrating an additional example of the stretchable circuit substrate of the present disclosure.
Figure 18B:
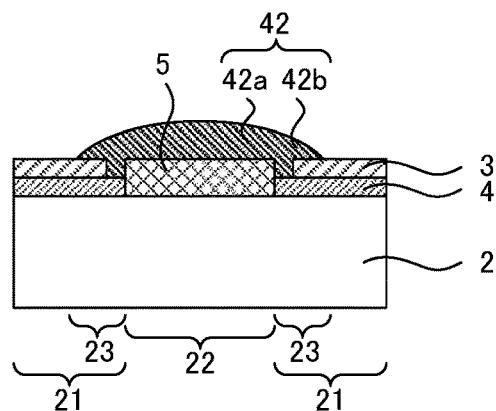

The second stretch controlling part 42 may, for example, have a shape of hemisphere that covers the entire region of the functional member 5 positioned in the functional member region 22 as shown in FIGS. 18A and 18B. In this case, the second part 42b positioned in the wiring region 21 side with respect to the first part 42a in the second stretch controlling part 42 would have a thickness which is gradually reduced towards the wiring region 21 side. Accordingly, the deformation properties of the functional member surrounding region in the base material would be gradually higher towards the wiring region. Thus, it is possible to inhibit the deformation properties of the base material from dramatically changing in the border between the functional member region and the wiring region, or near that region. Thereby, it is possible to inhibit the damage of the wiring in the border between the functional member region and the wiring region or near that region.

Figure 18C:
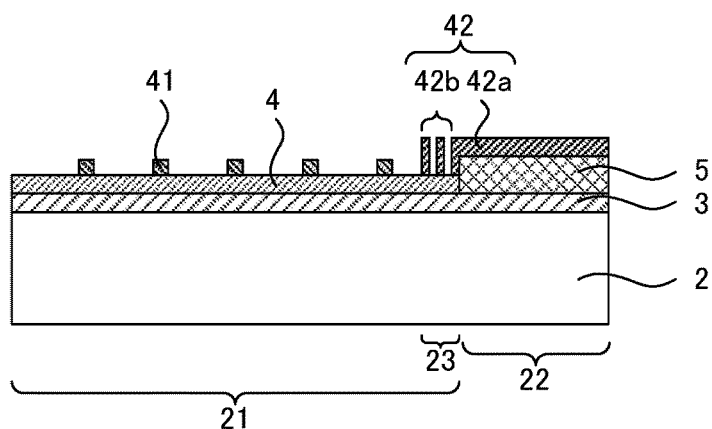

In the second stretch controlling part, for example, as shown in FIG. 18C, the density distribution of the second part 42b in the second stretch controlling part 42 may be smaller than the density distribution of the first part 42a in the second stretch controlling part 42. The second part 42b includes a plurality of members arranged with a space between each other as shown in FIG. 18C. The density distribution of the second part 42b may be gradually reduced towards the wiring region 21. For example, the width of the plurality of members configuring the secondpart may be gradually reduced towards the wiring region, and the space between the plurality of members configuring the second part may gradually increase towards the wiring region. Each member of the second part may be, for example, configured by the same material as that of the first part.

In this case, the deformation properties of the functional member surrounding region in the base material gradually increases towards the wiring region. Accordingly, it is possible to inhibit the deformation properties of the base material from dramatically changing in the border between the functional member region and the wiring region, or near that region. Thereby, it is possible to inhibit the damage of the wiring in the border between the functional member region and the wiring region or near that region.

Incidentally, the first part of the second stretch controlling part may also include a plurality of members arranged with a space between each other.

Also, when the stretchable circuit substrate of the present embodiment comprises the supporting base material between the base material and the wiring, the secondpart in the second stretch controlling part may be configured as a space part between the supporting base material and the base material. In this case, the first part in the second stretch controlling part is configured by a member that can function as an adhesive for adhering the supporting base material to the base material. The deformation properties of the second part are higher than the deformation properties of the first part since no member is present in the second part. Thus, the deformation properties of the functional member surrounding region in the base material gradually increases towards the wiring region. Accordingly, it is possible to inhibit the deformation properties of the base material from dramatically changing in the border between the functional member region and the wiring region, or near that region. Thereby, it is possible to inhibit the damage of the wiring in the border between the functional member region and the wiring region or near that region.

In the second stretch controlling part, the Young's modulus of the second part in the second stretch controlling part may be smaller than the Young's modulus of the first part in the second stretch controlling part. In this case, the deformation properties of the functional member surrounding region in the base material gradually increase towards the wiring region. Accordingly, it is possible to inhibit the deformation properties of the base material from dramatically changing in the border between the functional member region and the wiring region, or near that region. Thereby, it is possible to inhibit the damage of the wiring in the border between the functional member region and the wiring region or near that region.

Also, when the stretchable circuit substrate of the present embodiment comprises the supporting base material between the base material and the wiring, and when the second stretch controlling part is positioned between the supporting base material and the base material, the second stretch controlling part may be configured so as the Young's modulus of the second part in the second stretch controlling part becomes smaller than the Young's modulus of the first part. In this case, the second stretch controlling part may be configured by a member that can function as an adhesive for adhering the supporting base material to the base material.

Figure 18D:
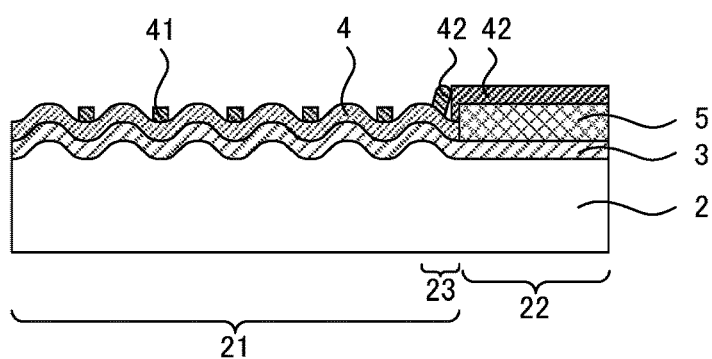

The second stretch controlling part 42 may, as shown in FIG. 18D, lean on the functional member 5. In this case, when the ridge of the bellows-like member arranged in the second stretch controlling part is about to be made shifted further to the functional member region 22 side, the second stretch controlling part 42 leaned onto the functional member 5 would be compressed and a repulsive force would occur. Accordingly, it is possible to inhibit the enlargement of the height of the ridge in the bellows-like member where the second stretch controlling part is arranged. Thereby, the damage of the electronically connected part between the functional member and the wiring can be inhibited. Incidentally, the second stretch controlling part 42 may, as shown in FIG. 18D, lean on the functional member 5 indirectly interposing other members such as the other second stretch controlling part, and although not illustrated, may directly lean on the functional member.

The second stretch controlling part may be positioned on the first surface side of the base material, may be positioned on the second surface side of the base material, and may be positioned inside the base material.

Figure 19A:
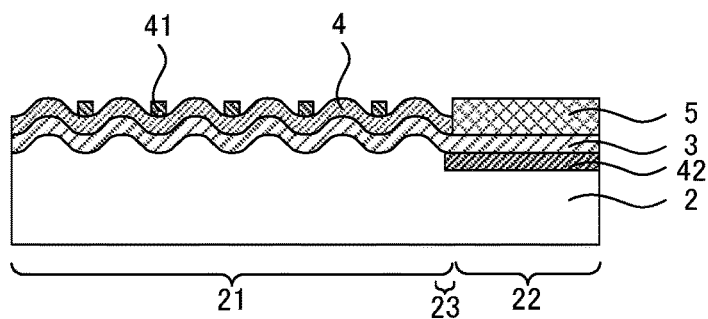
FIGS. 19A to 19E are schematic cross-sectional views illustrating an additional example of the stretchable circuit substrate of the present disclosure.

When the second stretch controlling part is positioned on the first surface side of the base material, the second stretch controlling part 42 may be, for example, positioned on the surface of the wiring 4 which is opposite side surface to the base material 2 side surface as shown in FIG. 10B, and may be positioned between the base material 2 and the wiring 4 as shown in FIG. 19A. When the second stretch controlling part is positioned between the base material and the wiring, the second stretch controlling part may be positioned on the first surface of the base material, and may be positioned in the concave part designed in the first surface of the base material. Also, when the stretchable circuit substrate of the present embodiment comprises the supporting base material between the base material and the wiring, the second stretch controlling part may be positioned on the surface of the wiring which is opposite side surface to the supporting base material side, and may be positioned between the supporting base material and the wiring.

Figure 19B:
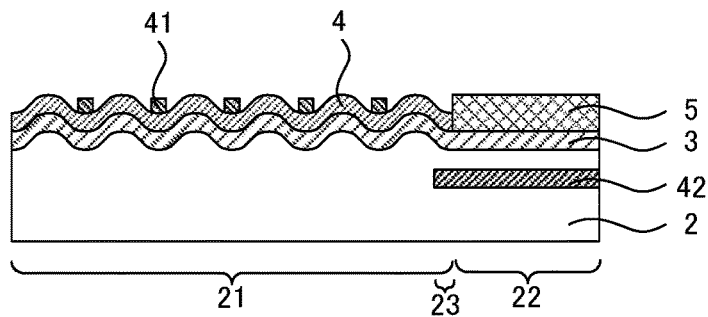

When the second stretch controlling part is positioned inside the base material, for example, as shown in FIG. 19B, the second stretch controlling part 42 is embedded inside the base material 2. Such a base material and a second stretch controlling part may be obtained by, for example, injecting the second stretch controlling part at an appropriate timing into a mold when the base material is fabricated by pouring a resin into the mold and the resin in the mold is solidified.

Figure 19C:
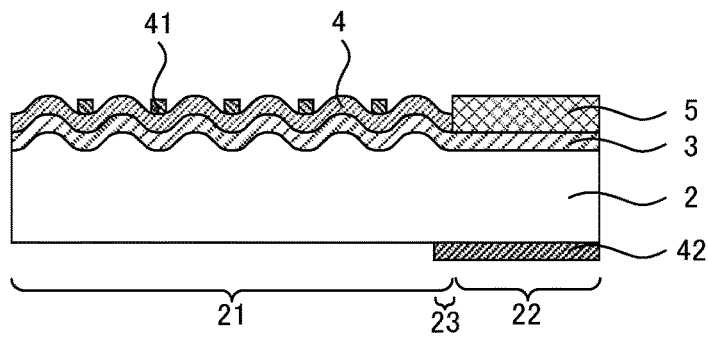
Figure 19D:
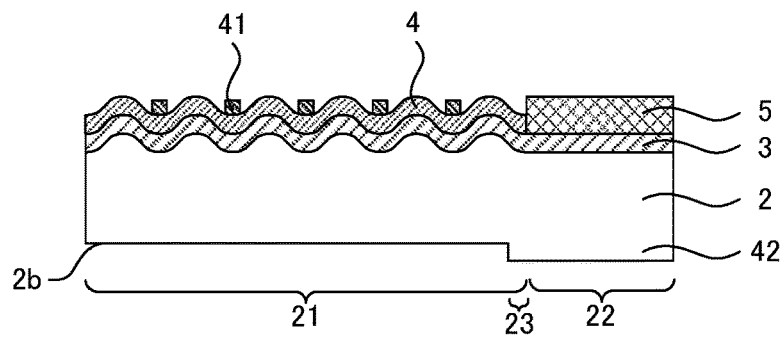
Figure 19E:
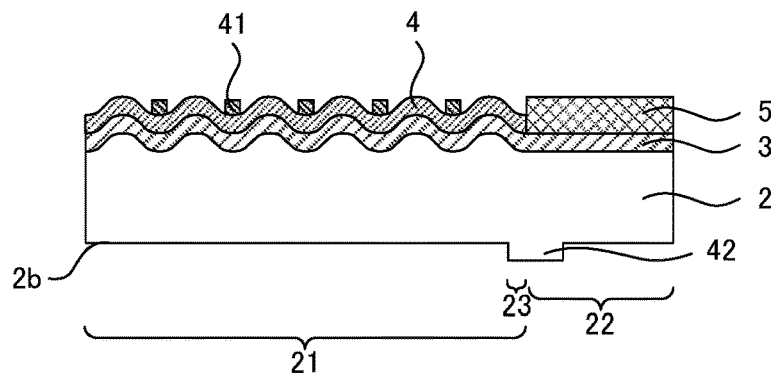

When the second stretch controlling part is positioned on the second surface side of the base material, the second stretch controlling part 42 may be, for example, configured separately from the base material as shown in FIG. 19C, and may be configured integrally as shown in FIGS. 19D and 19E. When the second stretch controlling part is configured integrally with the base material, the second stretch controlling part 42 may be, for example, a convex part protruded from the second surface 2b of the base material 2 as shown in FIG. 19E, and may be the one that appears in the functional member surrounding region 23 when a concave part is formed in the wiring region 21 around the functional member surrounding region 23 as shown in FIG. 19D. Incidentally, "integrally" means that there is no interface between the base material and the second stretch controlling part.

Incidentally, the position of the second stretch controlling part in the normal direction of the first surface in the base material may be same as or different from the position of the first stretch controlling part in the normal direction of the first surface in the base material.

Figure 20A:
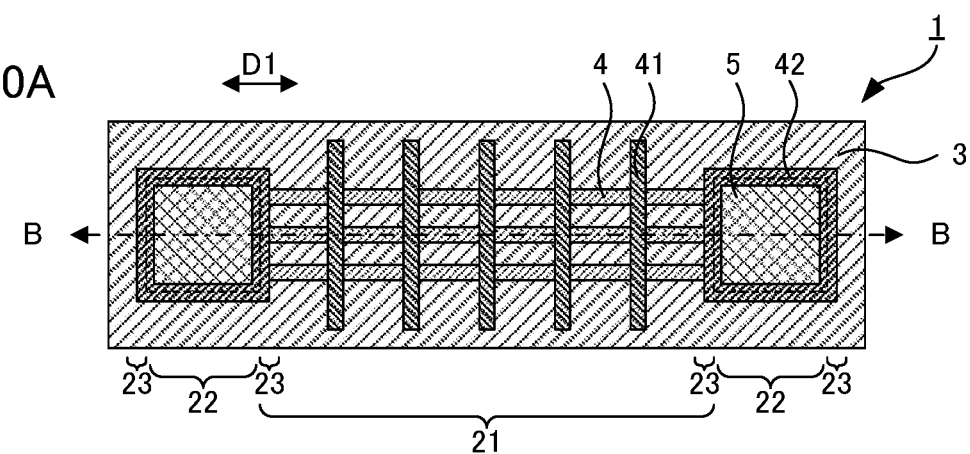
FIGS. 20A and 20B are schematic plan views illustrating an additional example of the stretchable circuit substrate of the present disclosure.

The second stretch controlling part is positioned at least in the functional member surrounding region, and is preferably extended to the border between the functional member surrounding region and the functional member region. For example, as shown in FIG. 10B, the second stretch controlling part 42 may be extended to the functional member region 22 exceeding the border between the functional member surrounding region 23 and the functional member region 22, and may be extended further to the entire region of the functional member region 22. Also, for example, as shown in FIG. 20A, the second stretch controlling part 42 may have a flame shape pattern that extends to follow the border between the functional member surrounding region 23 and the functional member region 22.

Figure 20B:
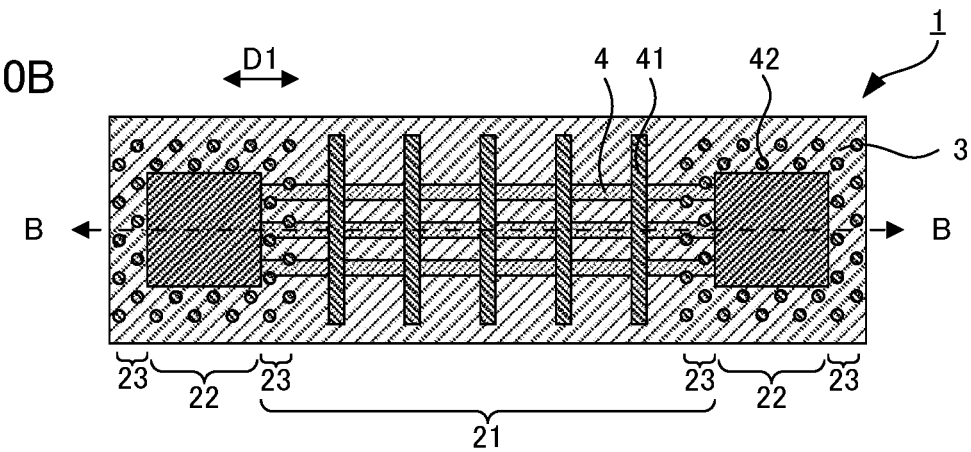

Also, the second stretch controlling part may include different patterns that vary with positions. For example, as shown in FIG. 20B, the second stretch controlling part 42 positioned in the functional member region 22 may have a square shape, and the second stretch controlling part 42 positioned in the functional member surrounding region 23 may have a circle shape. Incidentally, in the example shown in FIG. 20B, the first stretch controlling part 41 has a rectangular shape.

The functional member surrounding region is a region positioned to surround the functional member region. The functional member surrounding region is preferably a region in which the second stretch controlling part or the adjustment layer is arranged to inhibit stress concentration in the border between the functional member and the wiring. The size of the functional member surrounding region may be determined so as to inhibit stress concentration in the border between the functional member and the wiring.

The area of the functional member surrounding region may be, for example, ¼ or more of the area of the functional member region, and may be ½ or more of the area of the functional member region. Also, the area of the functional member surrounding region may be, for example, equal to or less than the area of the functional member region, and may be ¾ or less of the area of the functional member region.

The functional member surrounding region may be determined as a region in a certain distance from the edge of the functional member. The functional member surrounding region may be, for example, a region in 5 mm from the edge of the functional member, and may be a region in 2 mm.

Incidentally, in the functional member region, an additional member which is different from the second stretch controlling part may be arranged to inhibit the deformation of the functional member region.

8. Reinforcement Member

Figure 21:
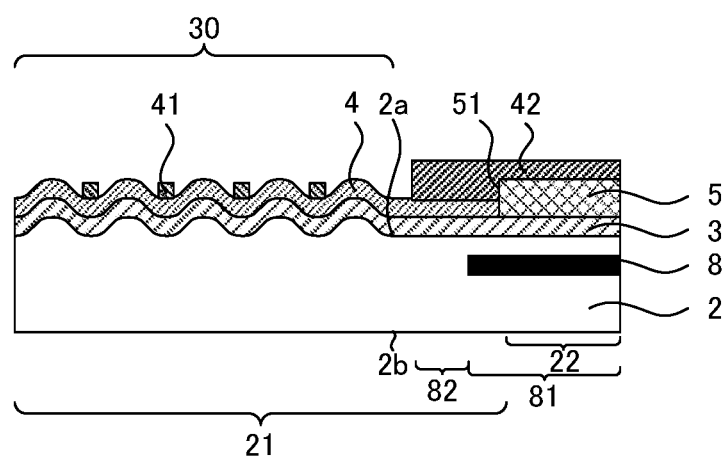
FIG. 21 is a schematic cross-sectional view illustrating an additional example of the stretchable circuit substrate of the present disclosure.

The stretchable circuit substrate of the present embodiment preferably comprises a reinforcement member in the position that overlaps the functional member region at least in a plan view. In FIG. 21, the stretchable circuit substrate is provided with reinforcement member 8 in the position overlaps the functional member region 22 at least in a plan view.

The reinforcement member 8 has a Young's modulus larger than the Young's modulus of the base material 2. The Young's modulus of the reinforcement member 8 is, for example, 1 GPa or more, and is more preferably 10 GPa or more. The Young's modulus of the reinforcement member 8 may be 100 times or more of the Young's modulus of the base material 2, and may be 1000 times or more thereof. Such a reinforcement member 8 is arranged on the base material 2, and thus it is possible to inhibit the part of the base material 2 overlapping the reinforcement member 8 from being stretched. The Young's modulus of the reinforcement member 8 may be 500 GPa or less. Also, the Young's modulus of the reinforcement member 8 may be 500000 times or less of the Young's modulus of the base material 2. The method for calculating the Young's modulus of the reinforcement member 8 is the same as the case for the base material 2.

Also, the reinforcement member 8 has bending rigidity larger than the bending rigidity of the base material 2. The bending rigidity of the reinforcement member 8 may be 100 times or more of the bending rigidity of the base material 2, and may be 1000 times or more thereof.

Examples of the material configuring the reinforcement member 8 may include a metal layer containing a metal material, general thermoplastic elastomers, acrylic, urethane-based, epoxy-based, polyester-based, vinylether-based, polyen-thiol-based, and silicone-based oligomers and polymers. Examples of the metal material may include copper, aluminium, and stainless steel. The thickness of the reinforcement member 8 is, for example, 10 μm or more.

In the example shown in FIG. 21, the reinforcement member 8 is embedded inside the base material 2. However, the position of the reinforcement member is arbitrary as long as the part of the base material 2 that overlaps the reinforcement member can be inhibited from stretching. For example, the reinforcement member 8 may be positioned on the second surface 2b side of the base material 2, and may be positioned on the first surface 2a side of the base material 2. Also, when the stretchable circuit substrate is provided with the supporting base material, the reinforcement member may be positioned on the first surface side of the supporting base material, and may be positioned on the second surface side of the supporting base material. Incidentally, the first surface and the second surface of the supporting base material respectively signify the same direction side surface as the first surface and the second surface of the base material.

In the example shown in FIG. 21, the reinforcement member 8 extends from the position where it overlaps the functional member 5 in the plane direction of the first surface 2a of the base material 2, to the wiring 4 side with respect to the edge 51 of the functional member 5. It means that the reinforcement member 8 is preferably positioned in the border between the functional member surrounding region and the functional member region in a plan view. In descriptions below, a region that overlaps the reinforcement member 8 when viewed along with the normal direction of the first side surface 2a of the base material 2, may be also referred to as reinforcement member region 81. Also, a region positioned surrounding the reinforcement member region 81 may be also referred to as reinforcement surrounding region 82. Also, a region including the reinforcement member region 81 and the reinforcement surrounding region 82 may be also referred to as a reinforcement region.

When the stretchable circuit substrate is provided with the reinforcement member 8, when the base material 2 stretches, stress would be concentrated at apart of the stretchable circuit substrate that overlaps the reinforcement member 8, which is the border between the reinforcement member region 81 and the reinforcement surrounding region 82. In consideration of this point, as shown in FIG. 21, it is preferable that the second stretch controlling part 42 is arranged in the reinforcement surrounding region 82, and also, the second stretch controlling part 42 extends to the border between the reinforcement surrounding region 82 and the reinforcement member region 81. Thereby, damage in members such as the wiring 4 in the border between the reinforcement member region 81 and the reinforcement member surrounding region 82 can be inhibited.

The size of the reinforcement surrounding region 82 may be determined so as to inhibit the stress concentration in the border between the reinforcement member region 81 and the reinforcement surrounding region 82. For example, the area of the reinforcement surrounding region 82 is ¼ or more of the area of the reinforcement member region 81, and may be ½ or more of the area of the reinforcement member region 81. Also, the area of the reinforcement surrounding region 82 is, for example, equal to or less than the area of the reinforcement member region 81, and may be ¾ or less of the area of the reinforcement member region 81.

The reinforcement surrounding region 82 may be determined as a region in a certain distance from the edge of the reinforcement member region 81. For example, the reinforcement surrounding region 82 may be, from the edge of the reinforcement member region 81, a region within 5 mm, and may be a region within 2 mm.

Figure 22:
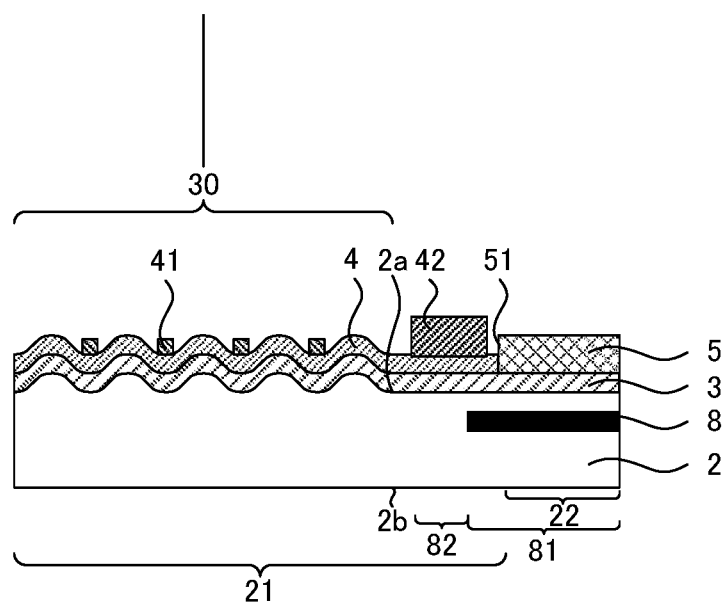
FIG. 22 is a schematic cross-sectional view illustrating an additional example of the stretchable circuit substrate of the present disclosure.

Incidentally, FIG. 21 shows an example where the second stretch controlling part 42 overlaps the entire region of the reinforcement member region 81, but the embodiment is not limited thereto. The position of the second stretch controlling part 42 is arbitrary as long as the second stretch controlling part 42 arranged in the reinforcement surrounding region 82 extends to the border between the reinforcement surrounding region 82 and the reinforcement member region 81. For example, as shown in FIG. 22, the second stretch controlling part 42 arranged in the reinforcement surrounding region 82 may not overlap the entire region of the reinforcement member region 81. In this case, the second stretch controlling part 42 may overlaps at least a part of the reinforcement member 8. For example, as shown in FIG. 22, the second stretch controlling part 42 may not overlap the functional member 5, but may partially overlap the reinforcement member 8; or although not illustrated, the second stretch controlling part 42 may partially overlap the functional member 5 and the reinforcement member 8.

Figure 23A:
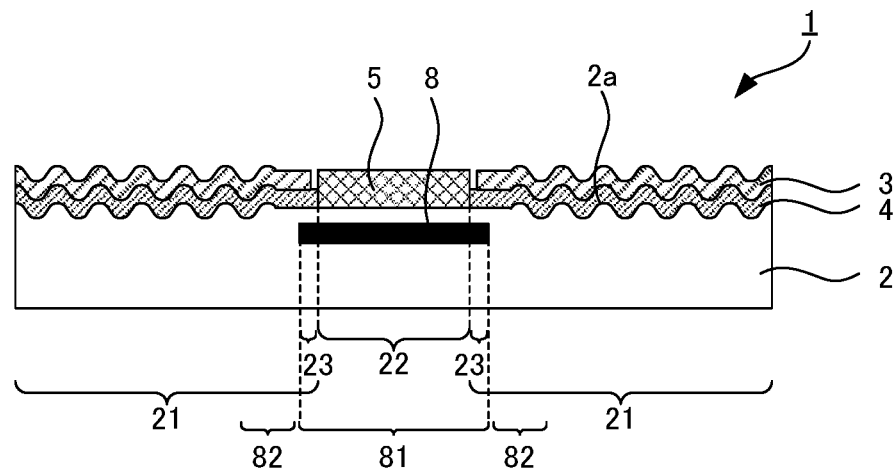
FIGS. 23A to 23C are schematic cross-sectional views illustrating an additional example of the stretchable circuit substrate of the present disclosure.
Figure 23B:
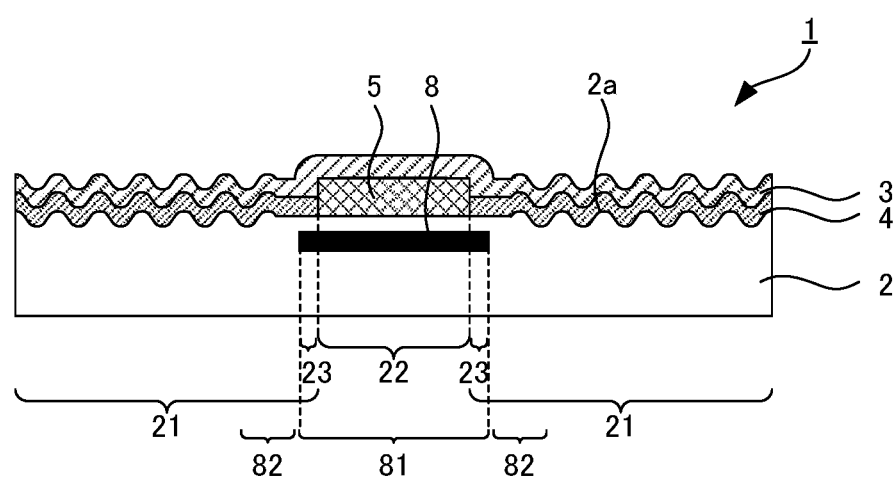
Figure 23C:
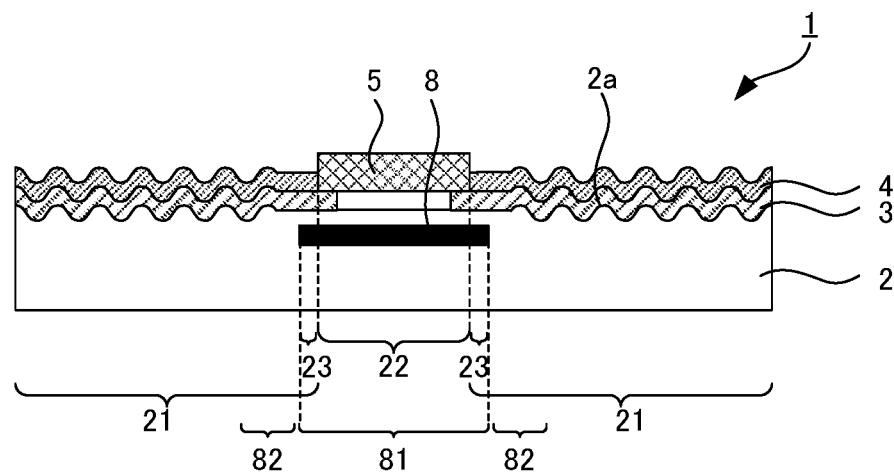

Also, as shown in FIG. 23A, it is preferable that the adjustment layer 3 is positioned in the border between the reinforcement member region 81 and the reinforcement surrounding region 82 in a plan view. In other words, it is preferable that the adjustment layer 3 is positioned so as to straddle the border between the reinforcement member region 81 and the reinforcement surrounding region 82. When the base material 2 stretches, stress easily concentrates in the border between the reinforcement member region 81 and the reinforcement surrounding region 82. In more specific, the border is, for example, a border between a hard region where the reinforcement member is present (reinforcement member region) and a region where the reinforcement member is not present (reinforcement surrounding region); thus, stress easily concentrates in the border. Whereas, the adjustment layer 3 is positioned in the border between the reinforcement member region 81 and the reinforcement surrounding region 82 in a plan view, and thus the stress may be dispersed. In this manner, the adjustment layer 3 is preferably positioned so as to straddle the edge of the reinforcement member. Also, as shown in FIG. 23B, the adjustment layer 3 is preferably positioned in the border between the functional member region 22 and the functional member surrounding region 23 in a plan view. In other words, it is preferable that the adjustment layer 3 is positioned so as to straddle the border between the functional member region 22 and the functional member surrounding region 23. When the base material 2 stretches, stress easily concentrates in the border between the functional member region 22 and the functional member surrounding region 23. In more specific, the border is, for example, a border between a hard region including the functional member and a material such as a resin of potting agent that covers the functional member (functional member region) and a soft region not including these (functional member surrounding region); thus, the stress easily concentrates in the border. Whereas, the adjustment layer 3 is positioned in the border between the functional member region 22 and the functional member surrounding region 23 in a plan view, and thus the stress may be dispersed. In this manner, it is preferable that the adjustment layer 3 is positioned so as to straddle the edge of the functional member, or the edge of the resin of a material such as a potting agent that covers the functional member. Further, as shown in FIG. 23C, the adjustment layer 3 may be positioned between the base material 2 and the wiring 4. The adjustment layer 3 may be positioned on the base material 2 side surface of the wiring 4, and may be positioned on the surface of the wiring 4 which is opposite side surface to the base material 2 side surface.

Figure 24:
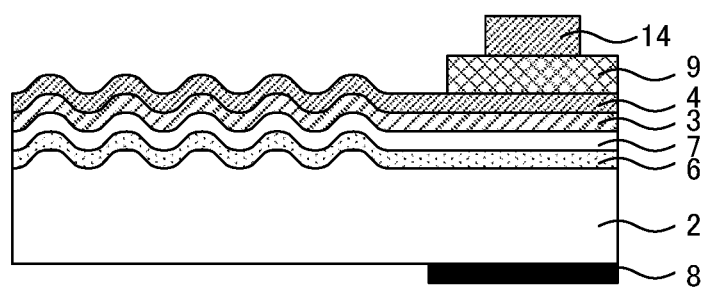
FIG. 24 is a schematic cross-sectional view illustrating an additional example of the stretchable circuit substrate of the present disclosure.

Also, as shown in FIG. 24, in the stretchable circuit substrate of the present embodiment, cross wiring 14 that layers the wiring 4 interposing insulating layer 9 may be further arranged in addition to the wiring 4. The cross wiring 14 is, for example, a wiring configuring an electronic part. The cross wiring 14 extends so as to cross the wiring 4 in a plan view. The insulating layer 9 is arranged between the wiring 4 and the cross wiring 14 and thus occurrence of short circuit between the cross wiring 14 and the wiring 4 can be inhibited. Examples of the material configuring the insulating layer 9 may include an organic resin such as polyimide, acryl, urethane, and epoxy resins, and an inorganic material such as $SiO_2$ and alumina. Also, although not illustrated in particular, the reinforcement member is preferably arranged so as to include at least an overlapping part of the wiring 4 and the cross wiring 14 in a plan view. Thereby, occurrence of short circuit between the wiring 4 and the cross wiring 14 due to deterioration of insulating properties or a crack in the insulating layer 9 can be inhibited when stress such as expansion and bend is applied to the stretchable circuit substrate.

9. Pressure Sensitive Adhesive Layer

The stretchable circuit substrate of the present embodiment may comprise a pressure sensitive adhesive layer on the surface of the wiring, the functional member, and the adjustment layer, which is opposite side surface to the base material side surface, or on the second surface side of the base material. The pressure sensitive adhesive layer is arranged to attach the stretchable circuit substrate of the present embodiment to a targeted object such as a human body.

The pressure sensitive adhesive is usually arranged after a member such as the wiring including the bellows-like member is formed; thus, does not include the bellows-like member.

The pressure sensitive adhesive layer is not particularly limited and general pressure sensitive adhesives may be used, and is appropriately selected depending on factors such as applications of the stretchable circuit substrate. Examples thereof may include an acrylic pressure sensitive adhesive, a silicone-based pressure sensitive adhesive, a urethane-based pressure sensitive adhesive, and a rubber-based pressure sensitive adhesive.

The thickness of the pressure sensitive adhesive layer may be a thickness which is stretchable and with which the stretchable circuit substrate can be attached to a targeted object, and is appropriately selected depending on factors such as applications of the stretchable circuit substrate. The thickness of the pressure sensitive adhesive layer may be, for example, in a range of 10 μm or more and 100 μm or less.

Also, a release layer may be positioned on the surface of the pressure sensitive adhesive layer which is opposite side surface to the base material side surface. As the release layer, general ones may be used.

Examples of a method for arranging the pressure sensitive adhesive layer may include a method of coating a pressure sensitive adhesive, and a method in which a pressure sensitive adhesive film having a pressure sensitive adhesive layer on one surface of the release layer is prepared and the pressure sensitive adhesive layer side of the pressure sensitive adhesive film is attached.

10. Method for Producing Stretchable Circuit Substrate

The stretchable circuit substrate of the present embodiment may be fabricated by a method in which the stretchable circuit substrate is expanded in advance.

The method for producing the stretchable circuit substrate of the present embodiment may comprise: for example, an expanding step of expanding a base material being stretchable; a wiring arranging step of arranging a wiring on the first surface side of the base material in a state the base material being expanded; an adjustment layer arranging step of arranging the adjustment layer on the first surface side of the base material in the state the base material being expanded; and a releasing step of removing tensile stress to the base material after the wiring arranging step and the adjustment layer arranging step. The wiring arranging step and the adjustment layer arranging step may be conducted in no particular order.

Figure 25A:
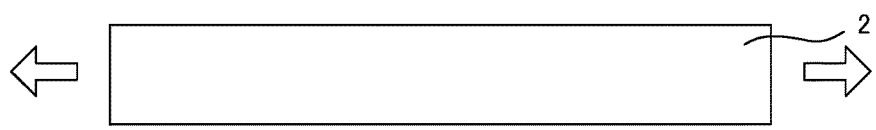
FIGS. 25A to 25E are process diagrams illustrating an example of the method for producing the stretchable circuit substrate of the present disclosure.
Figure 25B:
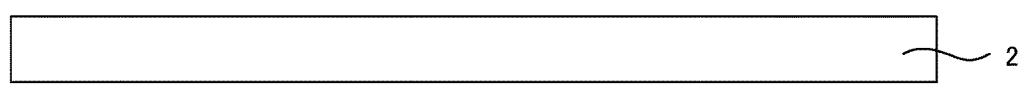
Figure 25C:
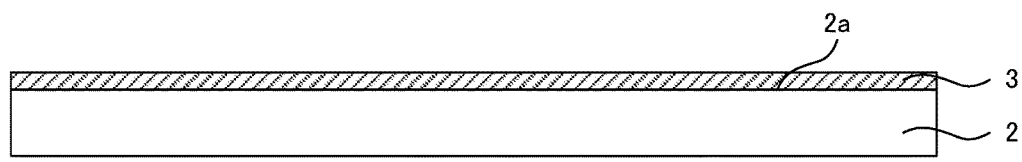
Figure 25D:
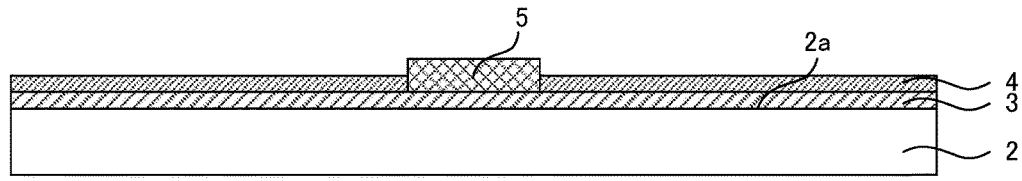
Figure 25E:
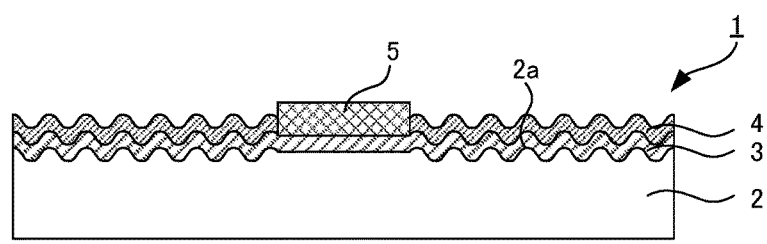

FIGS. 25A to 25E are process diagrams illustrating an example of the method for producing the stretchable circuit substrate of the present embodiment. First, as shown in FIGS. 25A and 25B, the base material 2 being stretchable is expanded. It may be also said that this step is to pre-stretch the base material being stretchable. Next, as shown in FIG. 25C, the adjustment layer 3 is arranged on the first surface 2a of the base material 2, in the state the base material 2 being expanded. Sequentially, as shown in FIG. 25D, the wiring 4 and the functional member 5 are arranged on the adjustment layer 3. Sequentially, as shown in FIG. 25E, tensile stress to the base material 2 is removed. On this occasion, the adjustment layer 3 and the wiring 4 change their forms to have the bellows-like member, along with the contraction of the base material 2 being stretchable. In this manner, the stretchable circuit substrate 1 may be obtained.

In the example shown in FIGS. 25A to 25E, the adjustment layer arranging step and the wiring arranging step are conducted in this order.

Figure 26A:
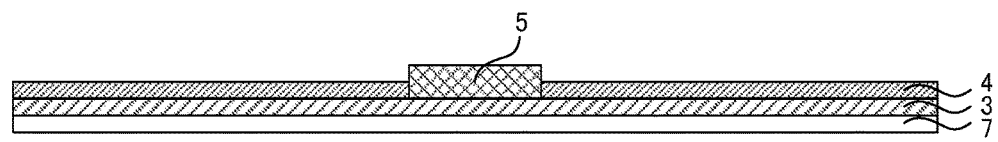
FIGS. 26A to 26E are process diagrams illustrating an additional example of the method for producing the stretchable circuit substrate of the present disclosure.
Figure 26B:
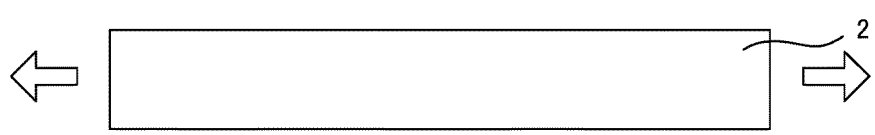
Figure 26C:
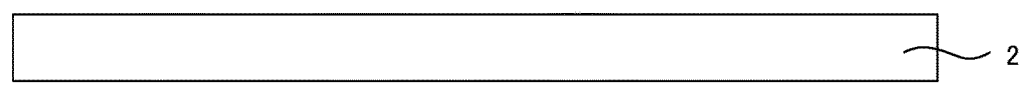
Figure 26D:
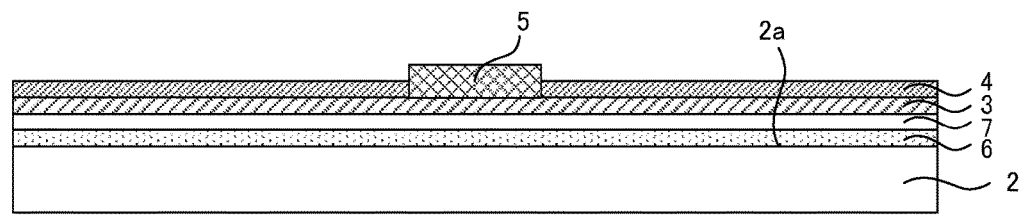
Figure 26E:
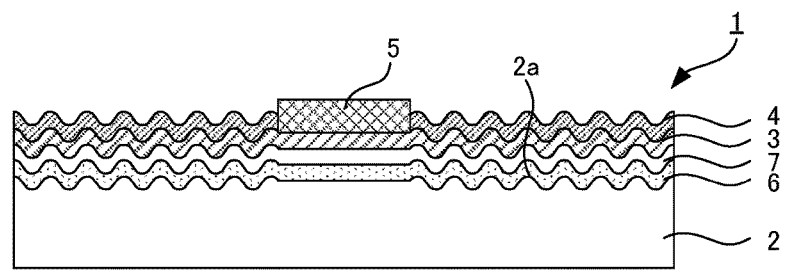

FIGS. 26A to 26E are process diagrams illustrating an additional example of the method for producing the stretchable circuit substrate of the present embodiment. First, as shown in FIG. 26A, the adjustment layer 3 is arranged on one surface of the supporting base material 7, and the wiring 4 and the functional member 5 are arranged on the adjustment layer 3 to fabricate a laminate. Also, as shown in FIGS. 26B to 26C, the base material 2 being stretchable is expanded. Next, as shown in FIG. 26D, the supporting base material 7 side surface of the laminate is attached to the first surface 2a of the base material 2 interposing the adhesive layer 6 in the state the base material 2 being expanded. Sequentially, as shown in FIG. 26E, tensile stress to the base material 2 is removed. On this occasion, the adjustment layer 3, the wiring 4, and the supporting base material 7 change their forms to have the bellows-like member along with the contraction of the base material 2 being stretchable. In this manner, the stretchable circuit substrate 1 may be obtained. In the example shown in FIGS. 26A to 26E, the adjustment layer arranging step and the wiring arranging step are simultaneously conducted.

In the expanding step, when the base material is to be expanded, for example, it may be expanded to uniaxial direction and may be expanded to biaxial direction.

In the expanding step, the base material is, on the basis of the normal state (non-stretched state), preferably expanded 20% (1.2 times of the initial length) or more, more preferably expanded 30% (1.3 times of the initial length) or more, and further preferably expanded 50% (1.5 times of the initial length) or more. Incidentally, the upper limit of the expansion rate of the base material is approximately 200%. The base material is expanded in the above described range and thus a stretchable wiring may be obtained.

The method for producing the stretchable circuit substrate of the present embodiment may comprise, after the expanding step as well as before the releasing step, a first stretch controlling part arranging step of arranging the first stretch controlling part on the first surface side of the base material or the second surface side of the base material in the state the base material being expanded, and a second stretch controlling part arranging step of arranging the second stretch controlling part on the first surface side of the base material or the second surface of the base material in the state the base material being expanded. In this case, the wiring arranging step, the adjustment layer arranging step, the first stretch controlling part arranging step, and the second stretch controlling part arranging step may be conducted in no particular order.

Also, when the first stretch controlling part and the second stretch controlling part are embedded inside the base material of the stretchable circuit substrate in the present embodiment, as described above, a base material including the first stretch controlling part and the second stretch controlling part inside in advance may be obtained.

Also, the method for producing the stretchable circuit substrate of the present embodiment may comprise a pressure sensitive adhesive layer arranging step of arranging the pressure sensitive adhesive layer after the releasing step.

Figure 27A:
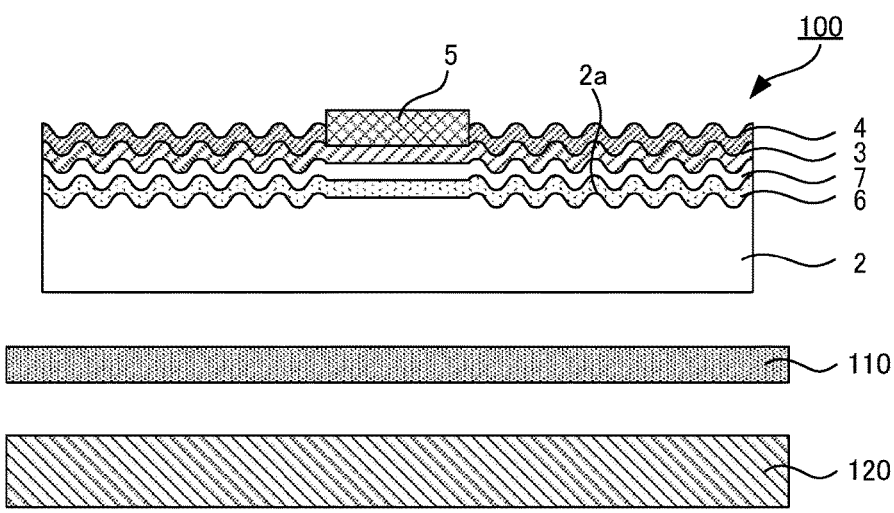
FIGS. 27A and 27B are process diagrams illustrating an additional example of the method for producing the stretchable circuit substrate of the present disclosure.
Figure 27B:
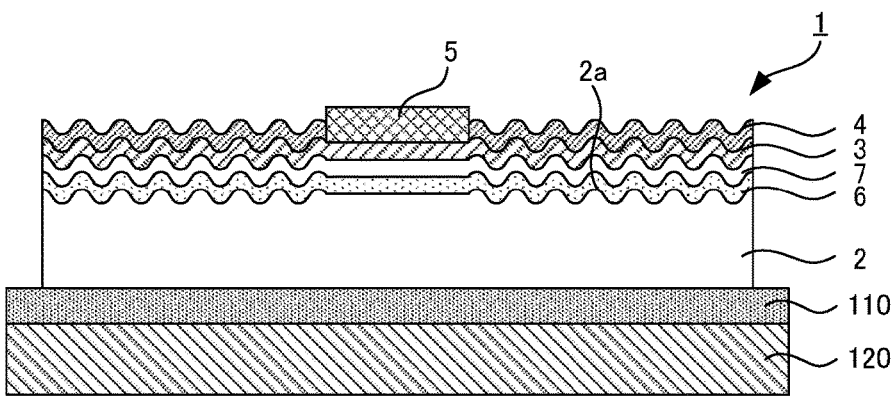

Also, the stretchable circuit substrate of the present embodiment may comprise a supporting body on the surface of the base material which is opposite side surface to the wiring. Further, it may comprise the pressure sensitive adhesive layer between the base material and the supporting body. FIGS. 27A and 27B are process diagrams illustrating an additional example of the method for producing the stretchable circuit substrate of the present embodiment. As shown in FIG. 27A, laminate 100 after the releasing step, pressure sensitive adhesive layer 110, and supporting body 120 are arranged in this order, and as shown in FIG. 27B, these members are integrated to obtain stretchable circuit substrate 1 further comprising the pressure sensitive adhesive layer 110 and the supporting body 120. The supporting body preferably is stretchable. Examples of the material for the supporting body may include a rubber, a resin, a fabric, and a metal. Incidentally, the pressure sensitive adhesive included in the pressure sensitive adhesive layer is as described above, but materials such as an ethylene-vinylacetate copolymer (EVA), an olefin-based pressure sensitive adhesive, a polyamide-based pressure sensitive adhesive, and a polyesterurethane-based adhesive may be further used. Examples of the method for integrating the laminate after the releasing step, the pressure sensitive adhesive layer, and the supporting body may include heating, pressurizing, and heat-pressurizing.

11. Applications

The stretchable circuit substrate of the present embodiment is stretchable, and thus may be applied to a curved surface and may follow the deformation. For such advantages, the stretchable circuit substrate of the present embodiment may be used in products such as a wearable device, a medical equipment, and a robot.

The stretchable circuit substrate of the present embodiment may be used by, for example, attaching thereof to a human skin, and may be used by installing to a wearable device and a robot. For example, the stretchable circuit substrate of the present embodiment may be used as at least a part of a product that is put on a part of body such as human arms. The stretchable circuit substrate may be expanded, and thus, for example, may be put on the body in the state the stretchable circuit substrate being expanded for the stretchable circuit substrate to be cohered to apart of the body. For this reason, excellent fit may be achieved. Also, it is possible to inhibit the resistance value of the wiring from decreasing when the stretchable circuit substrate is expanded, and thus excellent electric characteristics of the stretchable circuit substrate may be achieved. Also, the stretchable circuit substrate may be expanded and thus can be arranged to follow a curved surface and a three-dimensional shape.

Examples of the applications of the stretchable circuit substrate in the present embodiment may include applications to home appliances, applications to home decorations such as to give electronic function to products such as curtains and door knobs, applications to beddings such as to give electronic function to cushions and mattresses, applications to food packaging such as to give electronic function to plastic bottles and wraps, applications to robots, applications to cosmetics such as to give iontophoresis to liquid chemical permeated cosmetic masks and electronic stimulating shape-up products, and applications to apparel such as to give electronic function to products such as hats and clothes. In the present disclosure, an article to be used for any of these applications and the article comprising the above described stretchable circuit substrate may be provided.

Also, examples of the article in which the stretchable circuit substrate of the present disclosure is arranged may include shoes, insoles, masks, socks, stockings, wrist bands, clothes, headbands, gloves, inner wears, sports wears, diapers, hats, scarves, earmuffs, bags (such as backpacks, waist pouches, hand bags, sport bags, and suitcases), glasses, hearing aids, earrings, pierced earrings, necklaces, bracelets, anklets, belts, hair accessories, hair bands, headbands, clocks, collars, rings, false nails, baby carriages, drones, wheel chairs, swim wears, furniture (such as sofa, chairs, desks, lightings, doors, flower vases, handrails, beds, mattresses, futon mattresses, cushions, coverlets, blankets/sheets, and luncheon mats), sticking plasters, bandages, liquid chemical packages, tubes, liquid chemical permeated cosmetic masks, compresses, gauzes, tooth brushes, catheters, artificial hands, artificial legs, artificial eyes, contact lenses, supporters, balls, rackets, automobile interior seats, instrument panels, tires, flags, notes, books, robot hands, robot's exteriors, vital sensors, disposable bio-electrode, pocket body warmers, leads, individual ID recognizing deices, helmets, IC tags, batteries, and vinyl houses. Also, additional examples of the article in which the stretchable circuit substrate of the present embodiment is arranged may include health care products, sport products, amusement products, haptics products such as a vibration actuator device, energy management products such as an antenna of wireless electric supply, home appliance products, furniture and home decorations such as curtains, carpets and sofa, bedding products such as cushions and mattresses, packaging products such as plastic bottles and wraps, stationary products such as books and pens, and mobility-related products such as automobile interiors and seats. In the present disclosure, an article of any of these and the article comprising the above described stretchable circuit substrate may be provided.

B. Second Embodiment

The stretchable circuit substrate of the second embodiment in the present disclosure comprises: a base material being stretchable; a wiring which is on a first surface side of the base material, and which includes a bellows-like member including a plurality of ridges and recesses arranged in a first direction which is one of in-plane directions in the first surface of the base material; and an adjustment layer which includes the bellows-like member and is on the first surface side of the base material so as to at least overlaps, in a plan view, a wiring region in which the wiring is positioned; wherein the adjustment layer has a Young's modulus larger than a Young's modulus of the base material.

Here, in the production method of the stretchable circuit substrate, when the wiring changes its form to bellows-like shape, the degree of change in form varies with positions due to the factors such as uneven stretch of the base material when it is expanded and difference in distribution density of the metal thin film on the base material. When the degree of change in forms of the wiring is uneven, there may be some cases where the extent of curves and bends appear in the wiring locally increases. On the spot where the extent of the curves and the bends appear in the wiring is locally large, stress concentrates. Also, in general, an elastomer is used in the base material and a material such as a metal and an alloy is used in the wiring; thus, the Young's modulus of the wiring is extremely larger than the Young's modulus of the base material. In other words, the wiring is harder than the base material and thus difficultly changes its form. For that reason, on the spot where the extent of the curves and the bends appear in the wiring is locally large, stress easily concentrates. On the spot where stress concentrates in the wiring, fractures such as bent may be generated, and the resistance value may increase when the stretchable circuit substrate is repeatedly stretched as well.

Whereas, in the present embodiment, an adjustment layer having a larger Young's modulus than that of the base material is positioned in the wiring region of the first surface side of the base material, and thus stress concentration on the wiring due to the difference in Young's modulus between the base material and the wiring can be inhibited. Accordingly, even when the extent of curves and bends appear in the wiring locally increases, stress concentration on the spot where the extent of the curves and the bends appear in the wiring is locally large can be reduced. Thereby, the fracture of the wiring and the increase in the resistance value of the wiring when the stretchable circuit substrate is repeatedly stretched can be inhibited.

Incidentally, the base material being stretchable, the wiring, the functional member, the supporting base material, the first stretch controlling part, the second stretch controlling part, the pressure sensitive adhesive layer, and the method for producing the stretchable circuit substrate are the same as those of the stretchable circuit substrate in the first embodiment above; thus, the descriptions herein are omitted. Below, the adjustment layer of the stretchable circuit substrate in the present embodiment will be described.

<Adjustment Layer>

The adjustment layer in the present embodiment is a member typically positioned on the first surface side of the base material, as well as in the wiring region; includes a bellows-like member in which ridges and recesses in the normal direction of the first surface in the base material continuously appear along with the in-plane direction of the first surface in the base material; and has a Young's modulus larger than that of the base material.

The Young's modulus of the adjustment layer is larger than the Young's modulus of the base material. Also, the Young's modulus of the adjustment layer is preferably equal to or less than the Young's modulus of the wiring. The reason therefor is because stress concentration can be reduced when the adjustment layer having the Young's modulus larger than the Young's modulus of the base material and equal to or less than the Young's modulus of the wiring is positioned in the wiring region of the first surface side of the base material.

Incidentally, other points of the adjustment layer may be the same as those in the stretchable circuit substrate of the first embodiment described above.

The present disclosure is not limited to the above-described embodiments. The above-describe embodiments are examples, and everything having a composition that is substantially the same as the technical concept disclosed in the Scope of Claims of the present disclosure and having the same efficacy are included within the technical scope of the present disclosure.

EXAMPLES

Below, examples and comparative examples are shown and the present disclosure is described in greater detail.

Example 1

<Fabrication of Stretchable Base Material>

A pressure sensitive adhesive sheet (model no. 8146 from 3M) was used as an adhesive layer, two-pack addition-condensation type polydimethylsiloxane (PDMS) was coated on that pressure sensitive adhesive sheet so as the thickness became 900 μm, and the PDMS was cured to fabricate a first laminate including the adhesive layer and a stretchable base material. Sequentially, a part of the first laminate was taken out as a sample, and the Young's modulus of the stretchable base material was measured by a tensile test according to JIS K6251. As a result, the Young's modulus of the stretchable base material was 0.05 MPa. Also, the cross-sectional area of the stretchable base material was 0.45*10$^{-6}$ m$^2$.

<Formation of Wiring and Adjustment Layer>

A polyethylene naphthalate (PEN) film having a thickness of 2.5 μm was used as a supporting base material, Ag paste was screen-printed on the PEN film, and a wiring having a width of 200 μm and a length of 40 mm was arranged thereon. Also, a part of the supporting base material was taken out as a sample, and the Young's modulus of the supporting base material was measured by a tensile test according to JIS K6251. As a result, the Young's modulus of the supporting base material was 2.2 GPa.

Next, a urethane resin was screen-printed in a thickness of 30 μm so as to cover the wiring, and thereby an adjustment layer was formed. In this manner, a second laminate including the supporting base material, the wiring, and the adjustment layer was obtained. Sequentially, apart of the adjustment layer was taken out as a sample, and the Young's modulus of the adjustment layer was measured by a tensile test according to JIS K6251. As a result, the Young's modulus of the adjustment layer was 35 MPa.

Here, the magnitude relations of the Young's modulus of the PDMS stretchable base material, PEN supporting base material, the Ag wiring, and the urethane resin adjustment layer were as follows:

stretchable base material<adjustment layer<wiring<supporting base material.

<Fabrication of Stretchable Circuit Substrate>

The supporting base material side surface of the second laminate was attached to the adhesive layer side surface of the first laminate in the state the first laminate was uniaxially expanded 50%. The resistance of the wiring on this occasion was 35Ω.

Next, the expansion was released to contract the stretchable base material. Thereby, a concave and convex shape was generated on the surface of the supporting base material and the contraction was caused. On this occasion, the average of 5 periods therein was 620 μm, and the minimum radius of curvature was 45 μm. Also, the resistance of the wiring was 39Ω, and almost no change was seen.

Comparative Example 1

A first laminate and a second laminate were fabricated in the same manner as in Example 1 except that the urethane resin adjustment layer was not arranged on the supporting base material. Next, in the same manner as in Example 1, the supporting base material side of the second laminate was attached to the adhesive layer side surface of the first laminate in the state the first laminate was uniaxially expanded 50%. The resistance of the wiring on this occasion was 47Ω.

Next, the expansion was released to contract the stretchable base material. Thereby, a concave and convex shape was generated on the surface of the supporting base material, and the contraction was caused. On this occasion, the average of 5 periods therein was 420 μm, the standard deviation of the period was 67 μm, and the minimum radius curvature was 2 μm. Uneven wrinkles and the bend of the wiring were confirmed in the part of the concave and convex shape. Also, the resistance of the wiring was 81Ω, which was the resistance rise in two times or more.

Example 2

<Fabrication of Stretchable Base Material>

A pressure sensitive adhesive sheet (model no. 8146 from 3M) was used as an adhesive layer, two-pack addition-condensation type polydimethylsiloxane (PDMS) was coated on that pressure sensitive adhesive sheet, and the PDMS was cured to fabricate a first laminate including the adhesive layer and a stretchable base material.

<Formation of Wiring and Adjustment Layer>

A polyethylene naphthalate (PEN) film having a thickness of 2.5 μm was used as a supporting base material, and a copper layer having a thickness of 1 μm was formed on the PEN film using a vapor deposition method. Sequentially, the copper layer was processed using a photolithography method and an etching method. Thereby, a wiring having a width of 200 μm and a length of 40 mm was obtained.

Next, a urethane resin was screen-printed in a thickness of 30 μm so as to cover the wiring to form an adjustment layer. Thereby, a second laminate including the supporting base material, the wiring, and the adjustment layer was obtained.

Here, the magnitude relations of the Young's modulus of the PDMS stretchable base material, the PEN supporting base material, the Cu wiring, and the urethane resin adjustment layer were as follows:

stretchable base material (0.05 MPa)<adjustment layer (35 MPa)<supporting base material (520 MPa)<wiring (7500 MPa).

<Fabrication of Stretchable Circuit Substrate>

The supporting base material side surface of the second laminate was attached to the adhesive layer side surface of the first laminate in the state the first laminate was uniaxially expanded 50%. The resistance of the wiring on this occasion was 7.7Ω.

Next, the expansion was released to contract the stretchable base material. Thereby, a concave and convex shape was generated on the surface of the base material, and the contraction was caused. On this occasion, the average of 5 periods therein was 794 μm, and the minimum radius curvature was 51 μm. Also, the resistance of the wiring was 7.6Ω, and almost no change was seen.

Next, when the stretchable circuit substrate was continuously expanded 100,000 times in the direction to which the wiring extends, in an amount of 30% when the amount of post-contraction was 100%, the resistance value was 1.03 times which did not almost change.

Also, when a glass substrate (OA10G from Nippon Electric Glass Co., Ltd.; thickness of 0.7 mm) was disposed on the base material side of the stretchable circuit substrate, and in that state, it was heat-pressurized for 10 seconds at 120° C. and approximately 10 kPa/cm$^2$, the disorder in the shape of bellows was not seen.

Comparative Example 2

A first laminate and a second laminate were fabricated in the same manner as in Example 2, except that the urethane resin adjustment layer was not arranged on the supporting base material. Next, in the same manner as in Example 2, the supporting base material side surface of the second laminate was attached to the adhesive layer side surface of the first laminate in the state the first laminate was uniaxially expanded 50%. The resistance of the wiring on this occasion was 7.5Ω.

Next, the expansion was released to contract the stretchable base material. Thereby, a concave and convex shape was generated on the surface of the supporting base material, and the contraction was caused. On this occasion, the average of 5 periods therein was 158 μm and the minimum radius curvature was 10 μm. Uneven wrinkles and the bend of the wiring were confirmed in the part of the concave and convex shape. Also, the resistance of the wiring was 7.6Ω, and no resistance rise was seen; however, when the stretchable circuit substrate was continuously stretched in the direction to which the wiring extends in an amount of 30% when the amount of post-contraction was 100%, the wiring was cut at the 3000$^{th}$ time.

Also, when a glass substrate (OA10G from Nippon Electric Glass Co., Ltd.; thickness of 0.7 mm) was disposed on the base material side of the stretchable circuit substrate, and in that state, it was heat-pressurized for 10 seconds at 120° C. and approximately 10 kPa/cm$^2$, the shape of the bellows was smashed to form a trapezoid, and the cut of the wiring occurred.

Example 3

<Fabrication of Stretchable Base Material>
A first laminate including an adhesive layer and a stretchable base material was fabricated in the same manner as in Example 2.
<Formation of Wiring and Adjustment Layer>
A second laminate including a supporting base material, a wiring, and an adjustment layer was obtained in the same manner as in Example 2. Incidentally, as the wiring in the second laminate, a wiring having a pair of electrodes was formed. Next, a resistance chip (0Ω) having a size of 1.0 mm by 0.5 mm was mounted between the pair of electrodes using a solder. As the solder, TB48N742 from KOKI Company Ltd. was used.
<Fabrication of Stretchable Circuit Substrate>
The supporting base material side surface of the second laminate was attached to the adhesive layer side surface of the first laminate in the state the first laminate was uniaxially expanded 50%. The resistance of the wiring on this occasion was 6.7Ω.

Next, the expansion was released to contract the stretchable base material. Thereby, a concave and convex shape was generated on the surface of the supporting base material, and the contraction was caused. The resistance of the wiring was 6.6Ω. Also, when the stretchable circuit substrate was continuously stretched in the direction to which the wiring extends in an amount of 30% when the amount of the post-contraction was 100%, the wiring was cut at the 1400$^{th}$ time.

Example 4

A stretchable circuit substrate was fabricated in the same manner as in Example 3, except that an adjustment layer having a donut shape having an outer diameter of 12 mm by 6 mm and an inner diameter of 2 mm by 1 mm was further layered on the functional member surrounding region around the resistance chip. The resistance of the wiring was 6.5Ω. Also, when the stretchable circuit substrate was continuously expanded in the direction to which the wiring extended in an amount of 30% when the post-contraction was 100%, the wiring was cut at the 2700$^{th}$ time.

Comparative Example 3

A stretchable circuit substrate was fabricated in the same manner as in Example 3, except that the adjustment layer was not formed. The resistance of the wiring was 6.7Ω.

Also, when the stretchable circuit substrate was continuously stretched in the direction to which the wiring extended in an amount of 30% when the post-contraction was 100%, the wiring was cut at the 300$^{th}$ time.

Example 5

As a stretchable circuit substrate, one wherein a wiring and a reinforcement member were arranged on the first surface side of the base material was fabricated.
<Fabrication of Stretchable Base Material>
As an adhesive layer, a pressure sensitive adhesive sheet 814 (from 3M) was prepared. Sequentially, a polyimide film (UPILEX™ from Ube Industries Ltd.; thickness of 125 μm) having a size of 5 mm by 5 mm was arranged on the pressure sensitive adhesive sheet as a reinforcement member. Sequentially, two-pack addition-condensation type polydimethylsiloxane (hereinafter referred to as PDMS) as a base material was coated on the side where the reinforcement member was arranged on the adhesive layer so as the thickness becomes approximately 1 mm and the reinforcement member was buried, and cured. Thereby, a first laminate including the adhesive layer, the reinforcement member, and a stretchable base material was fabricated. In the first laminate, the reinforcement member is buried in the first surface side of the base material, and the adhesive layer is arranged on the first surface of the base material.
<Formation of Wiring and Adjustment Layer>
A polyethylene naphthalate (PEN) film having a thickness of 2.5 μm was used as a supporting base material, and a copper layer having a thickness of 1 μm was formed on the PEN film using a vapor deposition method. Sequentially, the copper layer was processed using a photolithography method and an etching method. Thereby, a wiring (wiring including a pair of electrodes) having a width of 200 μm and a length of 40 mm was obtained.

Next, a urethane resin was screen-printed in a thickness of 30 μm so as to cover the wiring to form an adjustment layer. On this occasion, for example, as shown in FIG. 23A, the adjustment layer 3 was formed so as to straddle the border between the reinforcement member region 81 and the reinforcement surrounding region 82 in a plan view. Thereby, a second laminate including the supporting base material, the wiring, and the adjustment layer was obtained. Next, a resistance chip (0Ω) having a size of 1.0 mm by 0.5 mm was mounted between the pair of electrodes using a solder. As the solder, TB48N742 from KOKI Company Ltd. was used.
<Fabrication of Stretchable Circuit Substrate>
The supporting base material side surface of the second laminate was attached to the adhesive layer side surface of the first laminate in the state the first laminate is uniaxially expanded 50%. On this occasion, the polyimide film (reinforcement member) in the first laminate and the resistance chip in the second laminate were arranged o as to overlap each other in a plan view.

Next, the expansion was released to contract the stretchable base material. Thereby, a concave and convex shape was generated on the surface of the supporting base material, and the contraction was caused. The resistance of the wiring was 6.6Ω. Also when the stretchable circuit substrate was continuously expanded 100,000 times in the direction to which the wiring extended in an amount of 30% when the post-contraction was 100%, the resistance value was 1.05 times and it did not almost change.

Example 6

A stretchable circuit substrate was fabricated in the same manner as in Example 5, except that the adjustment layer was coated on just the reinforcement surrounding region side (wiring region side) in a plan view, not to straddle the border between the reinforcement member region and the reinforcement surrounding region. The resistance of the wiring was 6.5Ω. Also, when the stretchable circuit substrate was continuously stretched 100,000 times in the direction to which the wiring extended in an amount of 30% when the post-contraction was 100%, the wiring was cut at the $7000^{th}$ time. In this manner, it was confirmed that the occurrence of wiring cut was further inhibited when the adjustment layer was positioned so as to straddle the border between the reinforcement member region and the reinforcement surrounding region in a plan view.

REFERENCE SIGNS LIST

1 . . . stretchable circuit substrate
2 . . . base material being stretchable
2a . . . first surface of base material being stretchable
2b . . . second surface of base material being stretchable
3 . . . adjustment layer
4 . . . wiring
5 . . . functional member
6 . . . adhesive layer
7 . . . supporting base material
21 . . . wiring region
22 . . . functional member region
23 . . . functional member surrounding region
30 . . . bellows-like member
31, 33, 35 . . . ridge
32, 34, 36 . . . recess
41 . . . first stretch controlling part
42 . . . second stretch controlling part

The invention claimed is:

1. A stretchable circuit substrate comprising:
a base material being stretchable;
a wiring which is on a first surface side of the base material, and which includes a bellows-like member including a plurality of ridges and recesses arranged in a first direction which is one of in-plane directions in the first surface side of the base material; and
an adjustment layer which includes the bellows-like member and is on the first surface side of the base material so as to at least overlap, in a plan view, a wiring region in which the wiring is positioned; wherein:
the adjustment layer has a Young's modulus smaller than a Young's modulus of the wiring;
the stretchable circuit substrate further comprises a supporting base material; and
the supporting base material has a Young's modulus larger than a Young's modulus of the base material.

2. The stretchable circuit substrate according to claim 1, wherein the Young's modulus of the adjustment layer is larger than a Young's modulus of the base material.

3. The stretchable circuit substrate according to claim 1, wherein the stretchable circuit substrate comprises the wiring region and a functional member region which is adjacent to the wiring region and to which a functional member is mounted; and
the adjustment layer is continuously positioned in the wiring region and the functional member region.

4. The stretchable circuit substrate according to claim 3, further comprising a functional member that is on the first surface side of the base material and positioned in the functional member region.

5. The stretchable circuit substrate according to claim 1, wherein
the wiring includes a terminal part to be connected to a functional member; and
the adjustment layer covers whole the wiring region excluding the terminal part of the wiring, in a plan view.

6. The stretchable circuit substrate according to claim 1, wherein the stretchable circuit substrate comprises the wiring region and a functional member region which is adjacent to the wiring region and to which a functional member is mounted; and
the adjustment layer is positioned in a border between the functional member region and a functional member surrounding region which is positioned around the functional member region, in a plan view.

7. The stretchable circuit substrate according to claim 1, wherein the stretchable circuit substrate comprises the wiring region and a functional member region which is adjacent to the wiring region and to which a functional member is mounted;
the stretchable circuit substrate comprises a reinforcement member which is positioned so as to at least overlap, in a plan view, the functional member region; and
the adjustment layer is positioned in a border between a reinforcement member region where the reinforcement member is positioned, and a reinforcement surrounding region positioned around the reinforcement member region.

8. The stretchable circuit substrate according to claim 1, comprising the supporting base material between the base material and the wiring.

9. The stretchable circuit substrate according to claim 1, wherein the adjustment layer is positioned on an opposite side surface to base material side surface of the wiring.

10. The stretchable circuit substrate according to claim 1, wherein the adjustment layer is positioned between the base material and the wiring.

11. The stretchable circuit substrate according to claim 1, wherein the stretchable circuit substrate further comprises a supporting base material between the base material and the wiring; and
the adjustment layer is positioned between the supporting base material and the wiring.

12. The stretchable circuit substrate according to claim 1, wherein an amplitude of ridges and recesses which appears at a part where a second surface positioned at an opposite side to the first surface side of the base material overlaps the bellows-like member, is smaller than the amplitude of ridges and recesses which appears at a part where the first surface side of the base material overlaps the bellows-like member.

13. The stretchable circuit substrate according to claim 12, wherein the amplitude of ridges and recesses which appears at a part where the second surface positioned at an opposite side to the first surface side of the base material overlaps the bellows-like member, is 0.9 times or less of the amplitude of ridges and recesses which appears at a part where the first surface side of the base material overlaps the bellows-like member.

14. The stretchable circuit substrate according to claim 1, wherein a cycle of ridges and recesses which appears at a part where a second surface positioned at an opposite side to the first surface side of the base material overlaps the bellows-like member, is larger than the cycle of ridges and recesses which appears at a part where the first surface side of the base material overlaps the bellows-like member.

15. The stretchable circuit substrate according to claim 14 wherein the cycle of ridges and recesses which appears at a part where the second surface positioned at an opposite side to the first surface side of the base material overlaps the bellows-like member, is 1.1 times or more of the cycle of ridges and recesses which appears at a part where the first surface side of the base material overlaps the bellows-like member.

16. The stretchable circuit substrate according to claim 1, wherein a position of ridges and recesses which appears at a part where a second surface positioned at an opposite side to the first surface side of the base material overlaps the bellows-like member, is out of a position of ridges and recesses which appears at a part where the first surface side of the base material overlaps the bellows-like member.

17. The stretchable circuit substrate according to claim 1, wherein, when F3 designates a cycle of ridges and recesses which appears at a part where the first surface side of the base material overlaps the bellows-like member, a position of ridges and recesses which appears at a part where a second surface positioned at an opposite side to the first surface side of the base material overlaps the bellows-like member is 0.1*F3 or more out of the position of ridges and recesses which appears at a part where the first surface side of the base material overlaps the bellows-like member.

18. The stretchable circuit substrate according to claim 1, wherein the stretchable circuit substrate comprises the wiring region and a functional member region which is adjacent to the wiring region and on which a functional member is mounted; and
    a thickness of the adjustment layer, at least partly, decreases along a direction from the functional member region to the wiring region.

19. An article comprising the stretchable circuit substrate according to claim 1.

20. A stretchable circuit substrate comprising:
    a base material being stretchable;
a wiring which is on a first surface side of the base material, and which includes a bellows-like member including a plurality of ridges and recesses arranged in a first direction which is one of in-plane directions in the first surface side of the base material; and
    an adjustment layer which includes the bellows-like member and is on the first surface side of the base material so as to at least overlap, in a plan view, a wiring region in which the wiring is positioned; wherein:
    the adjustment layer has a Young's modulus larger than a Young's modulus of the base material;
    the stretchable circuit substrate further comprises a supporting base material; and
    the supporting base material has a Young's modulus larger than a Young's modulus of the base material.

* * * * *